US012701730B2

(12) United States Patent
Murasaki

(10) Patent No.: US 12,701,730 B2
(45) Date of Patent: Aug. 4, 2026

(54) SEMICONDUCTOR DEVICE

(71) Applicant: ROHM CO., LTD., Kyoto (JP)

(72) Inventor: Kohei Murasaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 371 days.

(21) Appl. No.: 18/466,821

(22) Filed: Sep. 14, 2023

(65) Prior Publication Data

US 2024/0006518 A1     Jan. 4, 2024

Related U.S. Application Data

(63) Continuation of application No. PCT/JP2022/007067, filed on Feb. 22, 2022.

(30) Foreign Application Priority Data

Mar. 23, 2021   (JP) ................................. 2021-048987

(51) Int. Cl.
| | |
|---|---|
| *H10D 12/00* | (2025.01) |
| *H10D 12/01* | (2025.01) |
| *H10D 62/10* | (2025.01) |

(52) U.S. Cl.
CPC ......... *H10D 12/481* (2025.01); *H10D 12/038* (2025.01); *H10D 62/127* (2025.01)

(58) Field of Classification Search
CPC ...... H10D 12/038; H10D 62/60; H10D 8/422; H10D 12/481; H10D 62/107; H10D 62/127; H10D 64/117; H10D 64/232; H10D 62/393; H10D 62/157; H10D 62/109; H10D 12/031; H10D 62/108; H10D 62/8325;

(Continued)

(56) References Cited

U.S. PATENT DOCUMENTS

2015/0076554 A1* 3/2015 Laven .................. H10D 12/461
                                                              438/138
2015/0325558 A1* 11/2015 Hikasa ................. H10D 12/032
                                                              257/49

(Continued)

FOREIGN PATENT DOCUMENTS

| | | |
|---|---|---|
| JP | 2018-120990 A | 8/2018 |
| WO | 2017/187670 A1 | 11/2017 |
| WO | 2021/014570 A1 | 1/2021 |

OTHER PUBLICATIONS

International Search Report and Written Opinion mailed on May 17, 2022, received for PCT Application PCT/JP2022/007067, filed on Feb. 22, 2022, 9 pages including English Translation.

(Continued)

*Primary Examiner* — Mouloucoulaye Inoussa
(74) *Attorney, Agent, or Firm* — XSENSUS LLP

(57) ABSTRACT

This semiconductor device includes: an n-type drift layer; a p-type base region; a trench extending in the depth direction so as to pass through the base region and reach the drift layer; an insulating film formed on an inner surface of the trench; a gate trench surrounding the insulating film; and a p-type column region provided on the drift layer at a position at the bottom of the trench. The drift layer includes: a first region having a first concentration peak; and a second region that is provided at a position deeper than the trench and corresponding to the column region, and has a second concentration peak lower than the first concentration peak.

19 Claims, 24 Drawing Sheets

(58) Field of Classification Search
CPC .. H10D 30/668; H10D 30/0297; H10D 64/62; H10D 30/831; H10D 12/035; H10D 64/2527; H01L 21/7602; H01L 21/761; H01L 21/31; H01L 21/0334; H03K 17/145

See application file for complete search history.

(56) References Cited

U.S. PATENT DOCUMENTS

| | | | | |
|---|---|---|---|---|
| 2017/0323959 | A1* | 11/2017 | De-Michelis | H10D 62/142 |
| 2018/0040698 | A1* | 2/2018 | Kobayashi | H10D 62/8325 |
| 2018/0138264 | A1* | 5/2018 | Kinoshita | H10D 62/158 |
| 2018/0226400 | A1 | 8/2018 | Shinsho | |
| 2019/0206987 | A1* | 7/2019 | Adachi | H10D 12/031 |
| 2019/0221657 | A1* | 7/2019 | Yilmaz | H10D 64/117 |
| 2019/0312105 | A1* | 10/2019 | Sakurai | H10D 12/481 |
| 2020/0227405 | A1 | 7/2020 | Shinsho | |
| 2020/0295141 | A1* | 9/2020 | Okumura | H01L 21/047 |
| 2022/0069089 | A1* | 3/2022 | Kawada | H01L 21/049 |
| 2022/0140121 | A1* | 5/2022 | Miyata | H10D 62/177 |
| | | | | 257/330 |
| 2022/0208759 | A1 | 6/2022 | Shinsho | |
| 2022/0238655 | A1* | 7/2022 | Okumura | H10D 62/158 |
| 2022/0285483 | A1* | 9/2022 | Tsuji | H10D 62/393 |
| 2023/0135315 | A1* | 5/2023 | Fang | H10D 30/021 |
| | | | | 257/139 |
| 2023/0197799 | A1* | 6/2023 | Murasaki | H10D 64/112 |
| | | | | 257/139 |
| 2023/0343827 | A1* | 10/2023 | Liu | H10D 64/232 |
| 2024/0120412 | A1* | 4/2024 | Noguchi | H10D 64/117 |

OTHER PUBLICATIONS

Office Action dated Nov. 11, 2025, in corresponding Japanese patent application No. 2023-508813 (8 pages; with English translation).

* cited by examiner

SEMICONDUCTOR DEVICE

CROSS-REFERENCE TO RELATED APPLICATIONS

This is a continuation application of PCT Application No. PCT/JP2022/007067, filed on Feb. 22, 2022, which claims priority to Japanese Patent Application No. 2021-048987, filed on Mar. 23, 2021, the entire contents of each of which are incorporated herein by reference.

BACKGROUND

1. Field

The present disclosure relates to a semiconductor device.

2. Description of Related Art

A semiconductor device such as an insulated gate bipolar transistor (IGBT) has a trench gate structure that reduces the on-resistance (refer to, for example, Japanese Laid-Open Patent Publication No. 2018-120990).

BRIEF DESCRIPTION OF THE DRAWINGS

FIG. 16 is a graph illustrating the relationship of the collector-emitter saturation voltage and loss when the semiconductor device is turned on.

FIG. 17 is a graph illustrating the relationship of the collector-emitter saturation voltage and total loss when the semiconductor device is turned on.

DETAILED DESCRIPTION

Embodiments of a semiconductor device will now be described with reference to the drawings. The embodiments described below exemplify configurations and methods for embodying a technical concept without any intention to limit the material, shape, structure, arrangement, dimensions, and the like of each component.

Structure of Semiconductor Device

One embodiment of a semiconductor device 10 will now be described with reference to FIG. 1.

Figure 1:
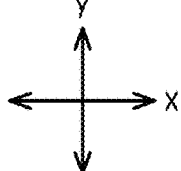
FIG. 1 is a plan view showing one embodiment of a semiconductor device.

As shown in FIG. 1, the semiconductor device 10 of the present embodiment is a trench gate type insulated gate bipolar transistor (IGBT). The semiconductor device 10 is used as, for example, a switching element in an inverter device for a vehicle.

The semiconductor device 10 has the form of a rectangular plate. In the present embodiment, the semiconductor device 10 includes a device main surface 10s that is, for example, shaped as a square. In the present embodiment, each side of the device main surface 10s has a length of approximately 3.5 mm. That is, the semiconductor device 10 of the present embodiment has a chip size of 3.5 mm×3.5 mm. The semiconductor device 10 includes a device back surface 10r (refer to FIG. 2), facing a direction opposite the device main surface 10s, and four device side surfaces 10a to 10d, between the device main surface 10s and the device back surface 10r. The device side surfaces 10a to 10d, for example, connect the device main surface 10s to the device back surface 10r and are orthogonal to both of the device main surface 10s and the device back surface 10r.

The semiconductor device 10 includes an emitter electrode 21, a gate electrode 22, and a collector electrode 27 (refer to FIG. 3) that serve as external electrodes used to connect the semiconductor device 10 to an external device.

The emitter electrode 21 forms the emitter of the IGBT and is the electrode through which the main current of the semiconductor device 10 flows. The emitter electrode 21 is formed on the device main surface 10s. A recess 21a is formed in the emitter electrode 21 at a portion that is in the central part with respect to the x-direction and is located closer to the device side surface 10c than the central part with respect to the y-direction. The recess 21a is open toward the device side surface 10c.

The gate electrode 22 forms the gate of the IGBT and is the electrode provided with a drive voltage signal from outside the semiconductor device 10 used to drive the semiconductor device 10. The gate electrode 22 forms the device main surface 10s. The gate electrode 22 is formed in the recess 21a of the emitter electrode 21.

Figure 2:
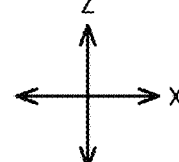
FIG. 2 is a cross-sectional view illustrating the structure of one example of a main cell region in the semiconductor device.

The collector electrode 27 shown in FIG. 2 forms the collector of the IGBT and is the electrode through which the main current of the semiconductor device 10 flows. More specifically, in the semiconductor device 10, the main current flows from the collector electrode 27 to the emitter electrode 21. The collector electrode 27 forms the device back surface 10r.

As shown by the broken lines in FIG. 1, the semiconductor device 10 includes a main cell region 11, in which main cells 11A (refer to FIG. 2) are formed, and a peripheral region 12, which is located outside the main cell region 11 surrounding the main cell region 11. In the present embodiment, the main cell region 11 forms the IGBT. The peripheral region 12 is the region that is not the main cell region 11.

The emitter electrode 21 is arranged in the main cell region 11. The emitter electrode 21 occupies most of the main cell region 11. The emitter electrode 21 is shaped in conformance with the main cell region 11 as viewed in the z-direction. The main cells 11A are not formed at positions overlapping the gate electrode 22 in the z-direction. More specifically, the main cell region 11 includes a recess 11a that is recessed to avoid the gate electrode 22.

The peripheral region 12 is where a termination structure is arranged to increase the dielectric breakdown voltage of the semiconductor device 10. The peripheral region 12 is defined by the peripheral area of the device main surface 10s as viewed in the z-direction. The peripheral region 12 surrounds the emitter electrode 21.

The peripheral region 12 includes the gate electrode 22, a gate finger 23, an emitter extension 24, field limiting rings (FLRs) 25, and an equipotential ring 26. The emitter electrode 21, the gate electrode 22, the emitter extension 24, the FLRs 25, and the equipotential ring 26 share a common metal film. The metal film is formed from, for example, a material including AlCu (alloy of aluminum and copper).

The gate finger 23 is configured so that the current supplied to the gate electrode 22 also flows to the main cells 11A at the part of the emitter electrode 21 separated from the gate electrode 22. The gate finger 23 is connected to the gate electrode 22.

The gate finger 23 surrounds the main cell region 11 as viewed in the z-direction. The gate finger 23 surrounds the emitter electrode 21 as viewed in the z-direction. The gate finger 23 includes a metal interconnection located at a position corresponding to the emitter electrode 21 and the gate electrode 22 in the z-direction.

The gate finger 23 includes gate fingers 23A and 23B. The gate finger 23A extends from the gate electrode 22 toward the device side surface 10a and surrounds the main cell region 11 from the device side surface 10c, the device side surface 10a, and the device side surface 10d. The gate finger 23B extends from the gate electrode 22 toward the device side surface 10b and surrounds the main cell region 11 from the device side surface 10c, the device side surface 10b, and the device side surface 10d. The distal end of the gate finger 23A and the distal end of the gate finger 23B face each other spaced apart by a gap in the x-direction at a part located toward the device side surface 10d from the emitter electrode 21.

The emitter extension 24 is integrated with the emitter electrode 21 and surrounds the two gate fingers 23A and 23B. The emitter extension 24 is looped so as to surround the main cell region 11 as viewed in the z-direction.

The FLRs 25 are located outside the emitter electrode 21 and form a termination structure that increases the breakdown voltage of the semiconductor device 10. The FLRs 25 are looped and surround the emitter electrode 21 and the gate electrode 22. In the present embodiment, the FLRs 25 form closed loops. The FLRs 25 weaken the electric field in the peripheral region 12 and limits the effect of external ions to increase the breakdown voltage of the semiconductor device 10.

The equipotential ring 26 is looped and surrounds the FLRs 25 to form a termination structure that increases the breakdown voltage of the semiconductor device 10. In the present embodiment, the equipotential ring 26 forms a closed loop. The equipotential ring 26 has the functionality for increasing the breakdown voltage of the semiconductor device 10.

Structure of Main Cell

The structure of the main cells 11A in the main cell region 11 will now be described. FIG. 2 shows one example of the cross-sectional structure of part of the main cell region 11 and part of the peripheral region 12. FIG. 2 shows some of the elements of the semiconductor device 10 in the main cell region 11 without hatching lines to aid understanding.

As shown in FIG. 2, the semiconductor device 10 includes a semiconductor substrate 30. The semiconductor substrate 30 is formed from a material containing, for example, an n-type silicon (Si). The semiconductor substrate 30 has a thickness in a range of 50 m to 200 m.

The semiconductor substrate 30 includes a substrate head surface 30s and a substrate back surface 30r at opposite sides in the z-direction. Thus, the z-direction is also the depth direction of the semiconductor substrate 30.

The semiconductor substrate 30 includes a stack of a $p^+$ type collector layer 31, an n-type buffer layer 32, and an n-type drift layer 33 arranged in order from the substrate back surface 30r toward the substrate head surface 30s. The collector electrode 27 is formed on the substrate back surface 30r. The collector electrode 27 is formed over substantially the entire substrate back surface 30r. The surface of the collector electrode 27 at the side opposite the side where the substrate back surface 30r is located defines the device back surface 10r of the semiconductor device 10.

The p-type dopant of the collector layer 31 is, for example, boron (B), aluminum (Al), or the like. The collector layer 31 has an impurity concentration in, for example, a range from $1\times10^{15}$ cm$^{-3}$ to $2\times10^{19}$ cm$^{-3}$.

The n-type dopant of the buffer layer 32 and the drift layer 33 is, for example, nitride (N), phosphorus (P), arsenic (As), or the like. The buffer layer 32 has an impurity concentration in, for example, a range of $1\times10^{15}$ cm$^{-3}$ to $5\times10^{17}$ cm$^{-3}$. The drift layer 33 has an impurity concentration that is lower than that of the buffer layer 32 and is, for example, in a range of $1\times10^{13}$ cm$^{-3}$ to $5\times10^{14}$ cm$^{-3}$.

The top surface of the drift layer 33, that is, the substrate head surface 30s includes a p-type base region 34. The base region 34 is formed over substantially the entire main cell region 11. The base region 34 has an impurity concentration in, for example, in a range of $1 \times 10^{16}$ cm$^{-3}$ to $1 \times 10^{18}$ cm$^{-3}$. The base region 34 has a depth from the substrate head surface 30$s$ that is, for example, in a range of 1.0 m to 3.0 m. An interface 39A is defined between the drift layer 33 and the base region 34. In the present embodiment, the p-type base region 34 corresponds to a body region of a second conductive type.

The top surface of the drift layer 33 (substrate head surface 30$s$) in the main cell region 11 includes trenches 35. In the present embodiment, the trenches 35 are arranged in a state separated from each other. For example, the trenches 35 extend in the y-direction and are separated from one another in the x-direction. This defines strips of the main cells 11A. The intervals between adjacent ones of the trenches 35 in the x-direction (distance between centers of trenches 35) is, for example, in a range of 0.5 m to 1.5 m. Each trench 35 has a width (dimension of trench 35 in x-direction) that is, for example, in a range of 0.5 m to 1.5 m. In the present embodiment, the interval between adjacent trenches 35 in the x-direction is less than or equal to the width of each trench 35. In other words, the distance D between adjacent ones of the trenches 35 in the arrangement direction of the trenches 35 is less than or equal to the width Wt of each trench 35. The trenches 35 may be formed in a lattice pattern to define the matrix of the main cells 11A.

Each trench 35 extends in the z-direction through the base region 34 to the drift layer 33. That is, each trench 35 extends through the base region 34 in the z-direction to an intermediate part of the drift layer 33. Thus, the z-direction is the depth direction of the trenches 35. More specifically, each trench 35 extends from the head surface of the drift layer 33 (substrate head surface 30$s$) in the z-direction. Each trench 35 extends through the base region 34 to reach a region in the drift layer 33 that is closer to the substrate back surface 30$r$ than the base region 34. In the present embodiment, each trench 35 has a depth of approximately 6.0 m.

A column region 38 of a second conductive type (p-type) is located in the drift layer 33 at a bottom portion 35$a$ of each trench 35. Thus, multiple column regions 38 are provided in correspondence with the multiple trenches 35 so that each trench 35 is provided with one of the column regions 38. The column regions 38 are arranged in a state separated from one another. In the present embodiment, each column region 38 is in an electrically floating state.

The column region 38 entirely covers the bottom portion 35$a$ of the corresponding trench 35. Thus, each column region 38 has a width We that is greater than or equal to the width Wt of each trench 35. The width Wt of the trench 35 is the dimension of the trench 35 in the arrangement direction of the trenches 35, and the width We of the column region 38 is the dimension of the column region 38 in the arrangement direction of the trenches 35. The column region 38 has a depth from the bottom portion 35$a$ of the trench 35 (hereafter, the depth He of the column region 38) that is, for example, in a range of 1 m to 2 m. In the present embodiment, the depth He of the column region 38 is approximately 1.5 m. In the present embodiment, the width We of the column region 38 is the dimension of the column region 38 in the x-direction, and the depth He of the column region 38 is the dimension of the column region 38 from the bottom portion 35$a$ of the trench 35 in the z-direction. As shown in FIG. 2, the depth He of the column region 38 is greater than the width We of the column region 38 (Wc<Hc). The impurity concentration of the column region 38, which is lower than that of the base region 34, is, for example, in a range of $1.0 \times 10^{15}$ cm$^{-3}$ to $5.0 \times 10^{17}$ cm$^{-3}$.

The top surface of the base region 34 in the main cell region 11 (substrate head surface 30$s$) includes n$^+$ type emitter regions 36. The emitter regions 36 are located at opposite sides of each trench 35 in the x-direction. That is, the emitter regions 36 are located in the base region 34 at opposite sides of each trench 35 in the arrangement direction of the trenches 35. Two emitter regions 36 are arranged between adjacent ones of the trenches 35 in the x-direction and are spaced apart from each other in the x-direction. Each emitter region 36 has a depth that is, for example, in a range of 0.2 m to 0.6 m. The emitter regions 36 have an impurity concentration that is greater than that of the base region 34 and is, for example, in a range of $1 \times 10^{19}$ cm$^{-3}$ to $5 \times 10^{20}$ cm$^{-3}$.

The top surface of the base region 34 in the main cell region 11 (substrate head surface 30$s$) includes p$^+$ type base contact regions 37. The base contact regions 37 are located adjacent to the emitter regions 36 in the x-direction. That is, each base contact region 37 is located between two emitter regions 36 in the x-direction that are located between adjacent ones of the trenches 35 in the x-direction. The base contact regions 37 may be formed deeper than the emitter regions 36. Each base contact region 37 has a depth that is, for example, in a range of 0.2 m to 0.8 m. Each base contact region 37 has an impurity concentration that is higher than that of the base region 34 and is, for example, in a range of $5 \times 10^{18}$ cm$^{-3}$ to $1 \times 10^{20}$ cm$^{-3}$. The base contact regions 37 are formed in the base region 34. This means that the base region 34 includes the base contact regions 37 that are where the impurity concentration is high in the base region 34.

An insulation film 41 is formed integrally on both of the wall surface of each trench 35 and the substrate head surface 30$s$. This means that the insulation film 41 is formed on the head surface of the drift layer 33. The insulation film 41 contains, for example, silicon oxide (SiO$_2$). The insulation film 41 has a thickness that is, for example, in a range of 1100 angstrom to 1300 angstrom. The insulation film 41 in the main cell region 11 forms a gate insulation film. The insulation film 41 formed on the substrate head surface 30$s$ has a back surface 41$r$ facing the same direction as the substrate back surface 30$r$. In the present embodiment, the back surface 41$r$ of the insulation film 41 is in contact with the substrate head surface 30$s$.

An electrode material formed by, for example, polysilicon or the like is embedded in each trench 35 under the insulation film 41. The electrode material embedded in each trench 35 is electrically connected to either one of the gate electrode 22 (gate finger 23) and the emitter electrode 21. Thus, the trenches 35 define gate trenches 22A and emitter trenches 21A when embedded with the electrode material. In the present embodiment, the gate trenches 22A and the emitter trenches 21A are arranged alternately in the arrangement direction of the trenches 35. In the present embodiment, the gate trenches 22A and the emitter trenches 21A are embedded with the electrode material to the open ends of the corresponding trenches 35. The gate trenches 22A form part of the gate electrode 22 (refer to FIG. 1).

An intermediate insulation film 42 is formed on a head surface 41S of the insulation film 41, which is arranged on the substrate head surface 30$s$. The intermediate insulation film 42 contains, for example, SiO$_2$. The thickness of the intermediate insulation film 42, which is greater than that of the insulation film 41, is in a range of 3000 angstrom to 15000 angstrom.

The emitter electrode 21 is formed on a head surface 42s of the intermediate insulation film 42. The intermediate insulation film 42 is an interlayer insulation film filling the space between the emitter electrode 21 and the gate trenches 22A and the space between the emitter electrode 21 and the emitter trenches 21A.

Contact holes 43 exposing the base contact regions 37 are formed in the main cell region 11 extending through both of the intermediate insulation film 42 and the insulation film 41. In the present embodiment, the contact holes 43 are formed for each of the trenches 35 in the main cell region 11. The emitter electrode 21 is partially embedded in the contact holes 43 to contact the base contact regions 37.

The emitter electrode 21 includes an electrode main portion 21c, which is formed on the head surface 42s of the intermediate insulation film 42, and embedded electrode portions 21b, which are embedded in the contact holes 43. In the present embodiment, the electrode main portion 21c is separate from the embedded electrode portions 21b. The electrode main portion 21c is arranged on the embedded electrode portions 21b.

More specifically, a barrier metal layer 21e is formed on the head surface 42s of the intermediate insulation film 42 and the wall surfaces of the contact holes 43 defined by the intermediate insulation film 42 and the insulation film 41. The barrier metal layer 21e is formed by, for example, a stack structure of titanium (Ti) and titanium nitride (TiN). The barrier metal layer 21e is formed on both of the embedded electrode portions 21b and the electrode main portion 21c.

The relationship in impurity concentration of the semiconductor regions in the semiconductor device 10 will now be described.

Figure 3:
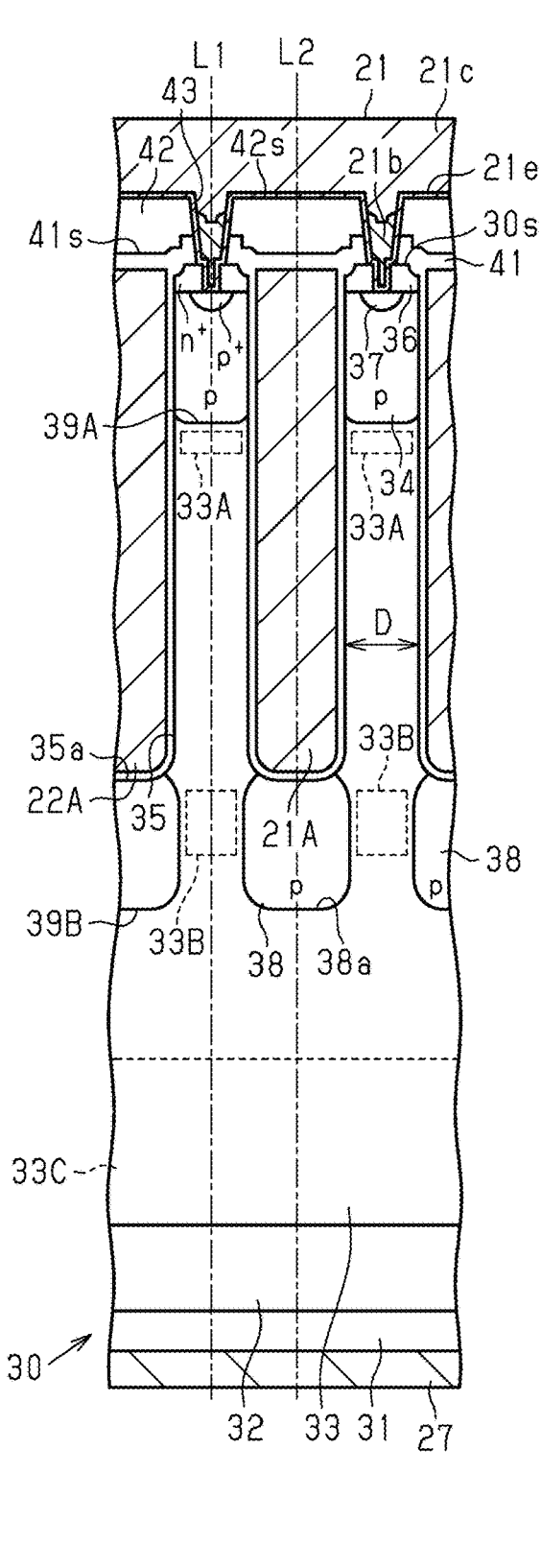
FIG. 3 is a partially enlarged view of FIG. 2.
Figure 3:
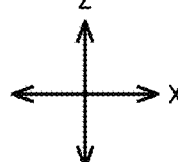
Figure 4:
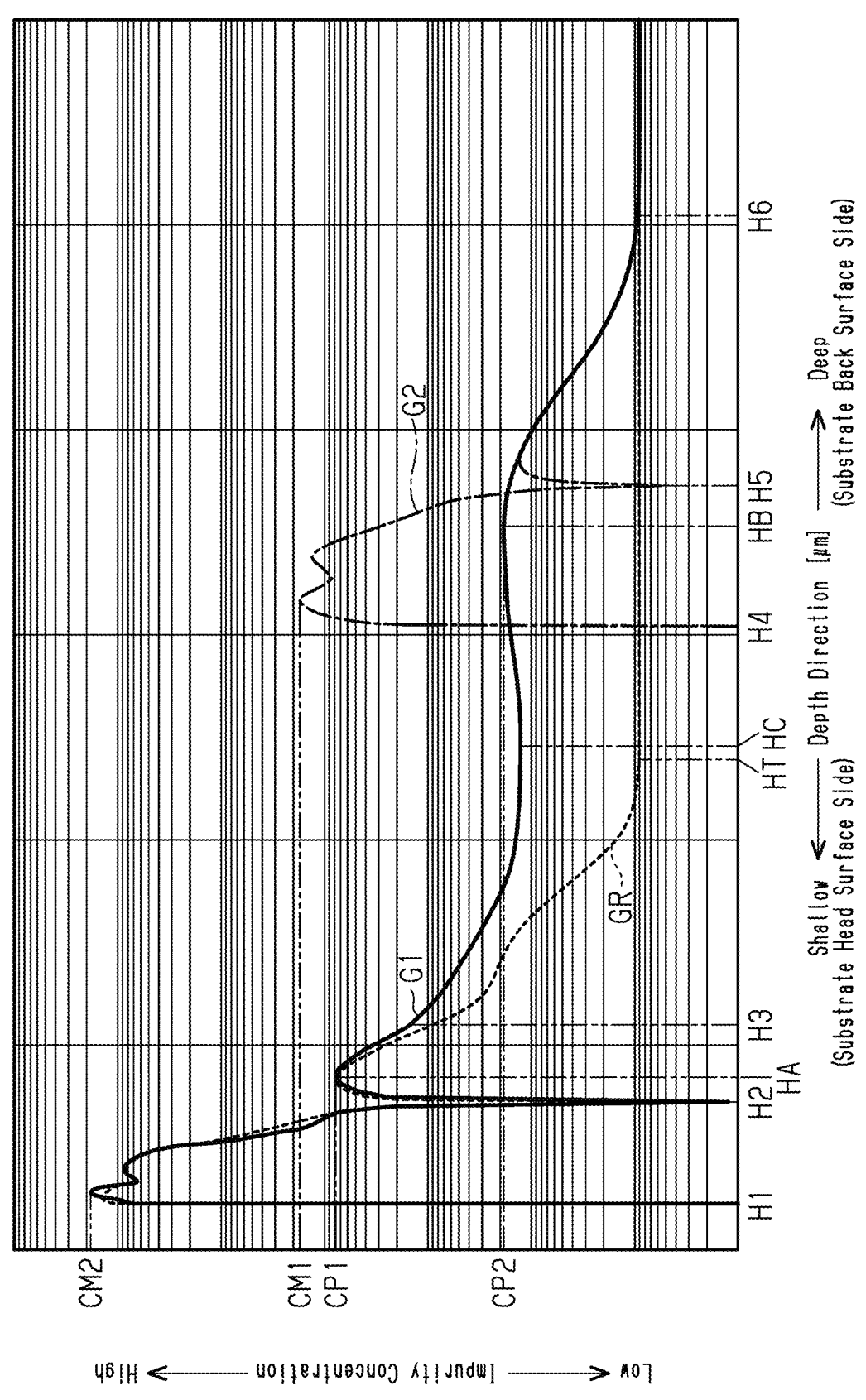
FIG. 4 is a graph illustrating the relationship of the drift layer depth and the impurity concentration in the semiconductor device.

FIG. 3 is a partially enlarged view of FIG. 2 showing some of the main cells 11A in the main cell region 11. FIG. 4 is a graph showing one example of the impurity concentration distribution at a first straight line L1 and a second straight line L2 extending in the z-direction of the main cells 11A in FIG. 3. The first straight line L1 is located between adjacent ones of the trenches 35 in the x-direction. The second straight line L2 is located in a trench 35. Graph G1 of the solid line in FIG. 4 shows the impurity concentration distribution at the first straight line L1, and graph G2 of the single-dashed line in FIG. 4 shows the impurity concentration distribution at the second straight line L2. In FIG. 4, the horizontal axis represents the depth from the head surface of the drift layer 33 (substrate head surface 30s), and the vertical axis represents the impurity concentration. The description hereafter will use the elements of the semiconductor device 10 shown in FIG. 3 as reference.

In FIG. 4, the region in a range of depth H1 to depth H2, corresponds to the base region 34, and the region deeper than depth H2 corresponds to a region of the drift layer 33 that is closer to the substrate back surface 30r than the base region 34. Depth H2 corresponds to the interface 39A between the drift layer 33 and the base region 34.

Depth H4, which is deeper than depth H2, corresponds to the bottom portion 35a of the trench 35. The region in a range of depth H4 to depth H5, corresponds to the column region 38. Depth H5 corresponds to an interface 39B between the drift layer 33 and the column region 38. The interface 39B is located between a bottom surface 38a of the column region 38 and the drift layer 33.

The region of the drift layer 33 adjacent to the base region 34 in the z-direction (depth direction in FIG. 4) is referred to as a first region 33A, the region of the drift layer 33 corresponding to the column region 38 in the z-direction is referred to as a second region 33B, and the region of the drift layer 33 deeper than the column region 38 in the z-direction is referred to as the third region 33C. Thus, the drift layer 33 includes the first region 33A, the second region 33B, and the third region 33C. In the present embodiment, the first region 33A, the second region 33B, and the third region 33C are separated from one another in the z-direction.

The first region 33A is the region from a position deeper than depth H2 to depth H3, inclusive. The first region 33A is a region proximate to the interface 39A between the drift layer 33 and the base region 34. As shown in FIG. 4, the first region 33A has a first concentration peak CP1. More specifically, in the first region 33A, the impurity concentration increases as the depth increases from depth H2, and the impurity concentration reaches the first concentration peak CP1 at depth HA. In the present embodiment, the first concentration peak CP1 is, for example, $9 \times 10^{16}$ cm$^{-3}$. Then, the impurity concentration decreases as the depth increases from depth HA. The impurity concentration of the first region 33A is, for example, greater than $1 \times 10^{16}$ cm$^{-3}$ and less than $1 \times 10^{17}$ cm$^{-3}$.

In the part of the first region 33A from a position deeper than depth HA to depth H3, inclusive, the decreasing rate of the impurity concentration increases as the depth increases from depth HA. At the region that is outside the first region 33A and deeper than depth H3, the impurity concentration decreases as the depth increases in the drift layer 33. In the present embodiment, in the range from depth H3 to depth HC that is deeper than depth H3 and shallower than depth H4, the impurity concentration decreases as the depth increases in the drift layer 33. At a region deeper than depth H3, the decreasing rate of the impurity concentration is smaller than the region from a position deeper than depth HA to depth H3, inclusive.

In the region from depth HC to depth H4, the impurity concentration gradually increases as the depth increases in the drift layer 33. In the region from depth H2 to depth H4, the impurity concentration becomes the lowest at depth HC. In the present embodiment, the impurity concentration at depth HC is, for example, higher than $1 \times 10^{15}$ cm$^{-3}$ and lower than $2 \times 10^{15}$ cm$^{-3}$. In this manner, in the region between the first region 33A and the second region 33B in the depth direction of the drift layer 33 (z-direction), the impurity concentration gradually decreases as the depth increases in the drift layer 33. This maintains a high impurity concentration in its entirety.

The second region 33B is the region from depth H4 to depth H5. In the present embodiment, the second region 33B is formed at a position corresponding to the column region 38 in the z-direction (depth direction). The second region 33B is deeper than the bottom portion 35a of the trench 35 and located at the position corresponding to the column region 38. The second region 33B includes a portion located at a position same as the position corresponding to the column region 38 in the depth direction.

As shown in FIG. 4, the second region 33B has a second concentration peak CP2 that is less than the first concentration peak CP1. More specifically, in the second region 33B, the impurity concentration increases as the depth increases from depth H4, and the impurity concentration reaches the second concentration peak CP2 at depth HB. Depth HB is where the column region 38 is located in the z-direction (depth direction). The second region 33B is where the impurity concentration becomes the highest and is located at the same position as the column region 38 in the z-direction. In the second region 33B, the impurity concentration decreases from depth HB toward depth H5. The second concentration peak CP2 is, for example, $2\times10^{15}$ cm$^{-3}$. The impurity concentration of the second region 33B is, for example, greater than $1\times10^{14}$ cm$^{-3}$ and less than or equal to $2\times10^{15}$ cm$^{-3}$.

In the region that is deeper than depth H5 and shallower than depth H6, the impurity concentration decreases as the depth increases in the drift layer 33. The impurity concentration in this region is greater than the impurity concentration at depth H6.

The third region 33C is the region from depth H6 and deeper. Depth H6 is deeper than the column region 38. This region is where the impurity concentration is the lowest in the drift layer 33. The third region 33C defines the end of the drift layer 33 that is closer to the substrate back surface 30$r$ in the z-direction (depth direction in FIG. 4). In the third region 33C, the impurity concentration is constant even if the depth increases from depth H6. The impurity concentration of the third region 33C is, for example, $1\times10^{14}$ cm$^{-3}$. Thus, the second concentration peak CP2 of the second region 33B is greater than the impurity concentration of the third region 33C. In this manner, the impurity concentration of the region between the second region 33B and the third region 33C (region deeper than depth H5 and shallower than depth H6) in the depth direction of the drift layer 33 (z-direction) is greater than the impurity concentration of the third region 33C.

As shown in FIG. 4, the maximum value CM1 of the impurity concentration in the column region 38 is greater than the second concentration peak CP2 of the second region 33B. Further, the maximum value CM1 of the impurity concentration in the column region 38 is greater than the first concentration peak CP1 of the first region 33A. The impurity concentration of the column region 38 is less than the impurity concentration of the base region 34. The maximum value CM1 of the impurity concentration in the column region 38 is less than the maximum value CM2 of the impurity concentration in the base region 34.

In the depth direction of the drift layer 33 (z-direction), the impurity concentration of the column region 38 is greater than the impurity concentration of the second region 33B throughout substantially the entire column region 38. More specifically, the impurity concentration of the column region 38 is greater than the impurity concentration of the second region 33B except at the proximity of the interface 39B (proximity of depth H5).

The range of the first region 33A in the z-direction (depth direction) may be freely changed. In one example, the first region 33A may include a region that is deeper than depth H3. For example, the first region 33A may be the region from depth H2 to depth HC. Further, for example, the first region 33A may be the region from depth H2 to depth H4.

The range of the second region 33B in the z-direction (depth direction) may be freely changed. In one example, the second region 33B may include a region that is shallower than depth H4. In one example, the second region 33B may be the region from depth HC to depth H5. In this case, the first region 33A is the region from depth H2 to depth H3 or the region from depth H2 to depth HC. Further, for example, the second region 33B may be the region from depth H3 to depth H5. In this case, the first region 33A is the region from depth H2 to depth H3.

Further, in one example, the second region 33B may include a region that is deeper than depth H5. In one example, the second region 33B is the region from depth H4 to depth H6. That is, the second region 33B may be any region from depth H3 to depth H6. In this manner, the second region 33B may include a portion located at a position separated from the position corresponding to the column region 38 in the depth direction.

Method for Manufacturing Semiconductor Device

A method for manufacturing the semiconductor device 10 of the present embodiment will now be described with reference to FIGS. 5 to 11. Hereafter, a method for manufacturing the main cell region 11 will be described. For the sake of brevity, the method for manufacturing a single semiconductor device 10 will be described with reference to FIGS. 5 to 11. The method for manufacturing the semiconductor device 10 of the present embodiment is not limited to a method for manufacturing a single semiconductor device 10 and may be a method for manufacturing a plurality of semiconductor devices 10.

Figure 5:
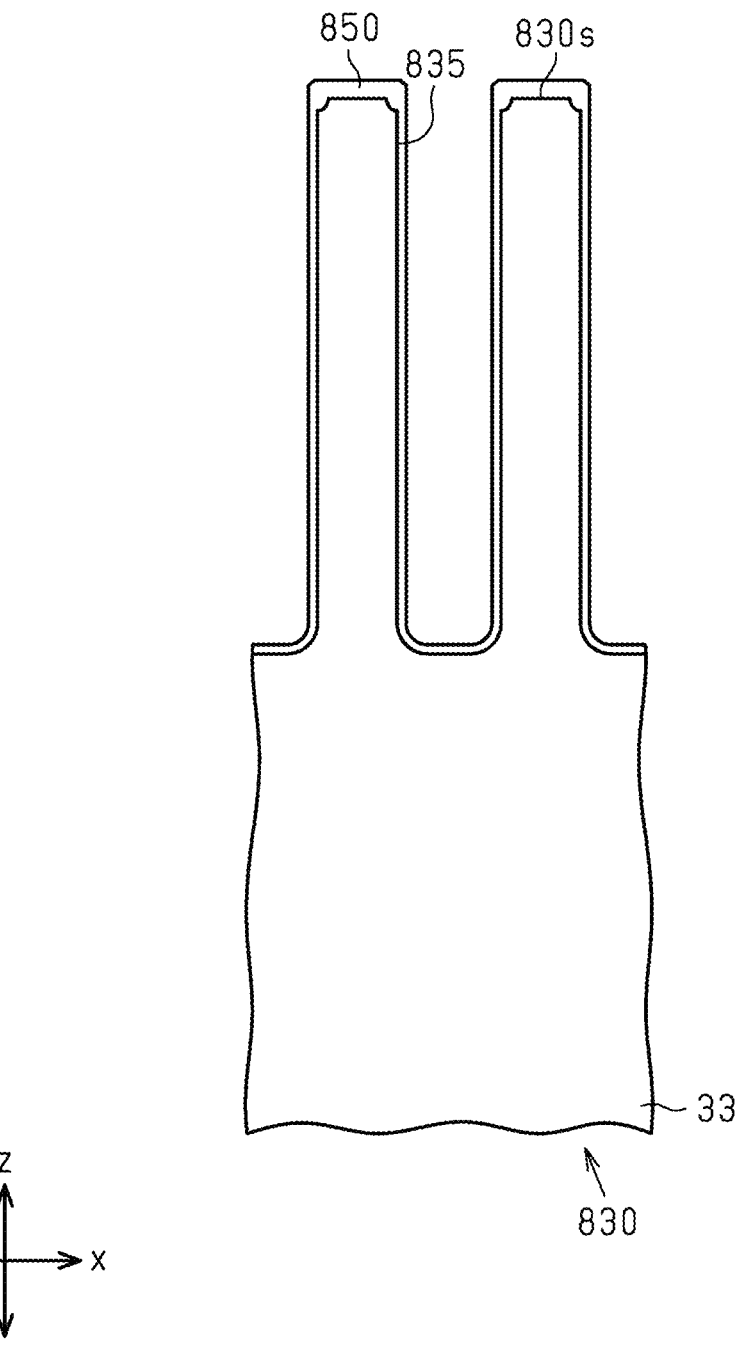
FIG. 5 is a diagram illustrating one example of a manufacturing step in a method for manufacturing the semiconductor device.

The method for manufacturing the semiconductor device 10 of the present embodiment includes a step of preparing a semiconductor substrate 830 formed from a material containing Si. As shown in FIG. 5, the semiconductor substrate 830 includes the n-type drift layer 33 serving as a semiconductor layer of the first conductive type. The drift layer 33 is formed over the entire semiconductor substrate 830. The impurity concentration of the drift layer 33 is, for example, $1\times10^{14}$ cm$^{-3}$. The semiconductor substrate 830 includes a substrate head surface 830$s$ and a substrate back surface (not shown) at opposite sides in the thickness direction (z-direction). Thus, the substrate head surface 830$s$ is the head surface of the drift layer 33.

Then, as shown in FIG. 5, the method for manufacturing the semiconductor device 10 of the present embodiment includes a step of forming trenches 835 in the semiconductor substrate 830. More specifically, a trench mask (not shown) is first formed on the substrate head surface 830$s$ of the semiconductor substrate 830. Then, etching is selectively performed with the trench mask. That is, etching is performed on regions of the trench mask that form the trenches 835 as viewed in the z-direction. The trench mask exposes regions in the substrate head surface 830$s$ of the semiconductor substrate 830 where the trenches 835 are formed. Then, etching is performed on the substrate head surface 830$s$ of the semiconductor substrate 830 at regions where the trenches 835 are formed. This forms the trenches 835 in the semiconductor substrate 830.

Then, the method for manufacturing the semiconductor device 10 of the present embodiment includes a step of forming a sacrificial oxide film 850 on the trenches 835 and the head surface of the semiconductor substrate 830. The sacrificial oxide film 850 is formed by thermally oxidizing the semiconductor substrate 830. The sacrificial oxide film 850 is formed from a material containing a silicon oxide (SiO$_2$).

Figure 6:
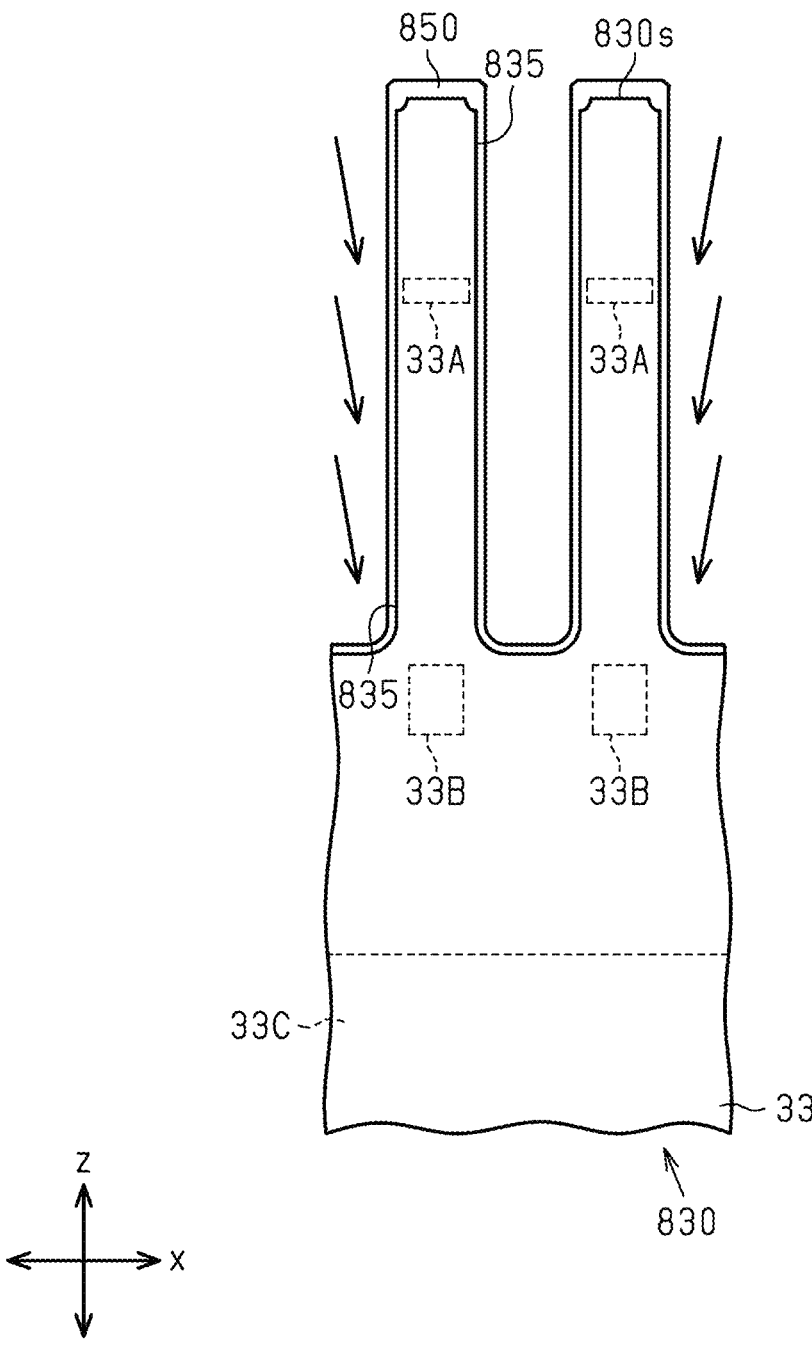
FIG. 6 is a diagram illustrating one example of a manufacturing step in the method for manufacturing the semiconductor device.

As shown in FIG. 6, the method for manufacturing the semiconductor device 10 of the present embodiment includes a step of implanting an impurity of a first conductive type (n-type) in the drift layer 33.

In this step, the impurities are implanted from the trenches 835 in a direction inclined relative to the z-direction into the drift layer 33 and then dispersed. In one example, the impurities are implanted in a direction inclined by 7° relative to the z-direction via the trenches 835 into the drift layer 33 and then dispersed. This forms the first region 33A, the second region 33B, and the third region 33C in the drift layer 33. The first region 33A includes the first concentration peak CP1. The impurity concentration of the first region 33A is, for example, greater than $1\times10^{15}$ cm$^{-3}$ and less than $1\times10^{17}$ cm$^{-3}$. The second region 33B includes the second concentration peak CP2, which is lower than the first concentration peak CP1. The impurity concentration of the second region 33B is, for example, greater than $1 \times 10^{14}$ cm$^{-3}$ and less than or equal to $2 \times 10^{15}$ cm$^{-3}$. The third region 33C is closer to the substrate back surface than the trenches 835. The impurity concentration of the third region 33C is, for example, $1 \times 10^{14}$ cm$^{-3}$.

Figure 7:
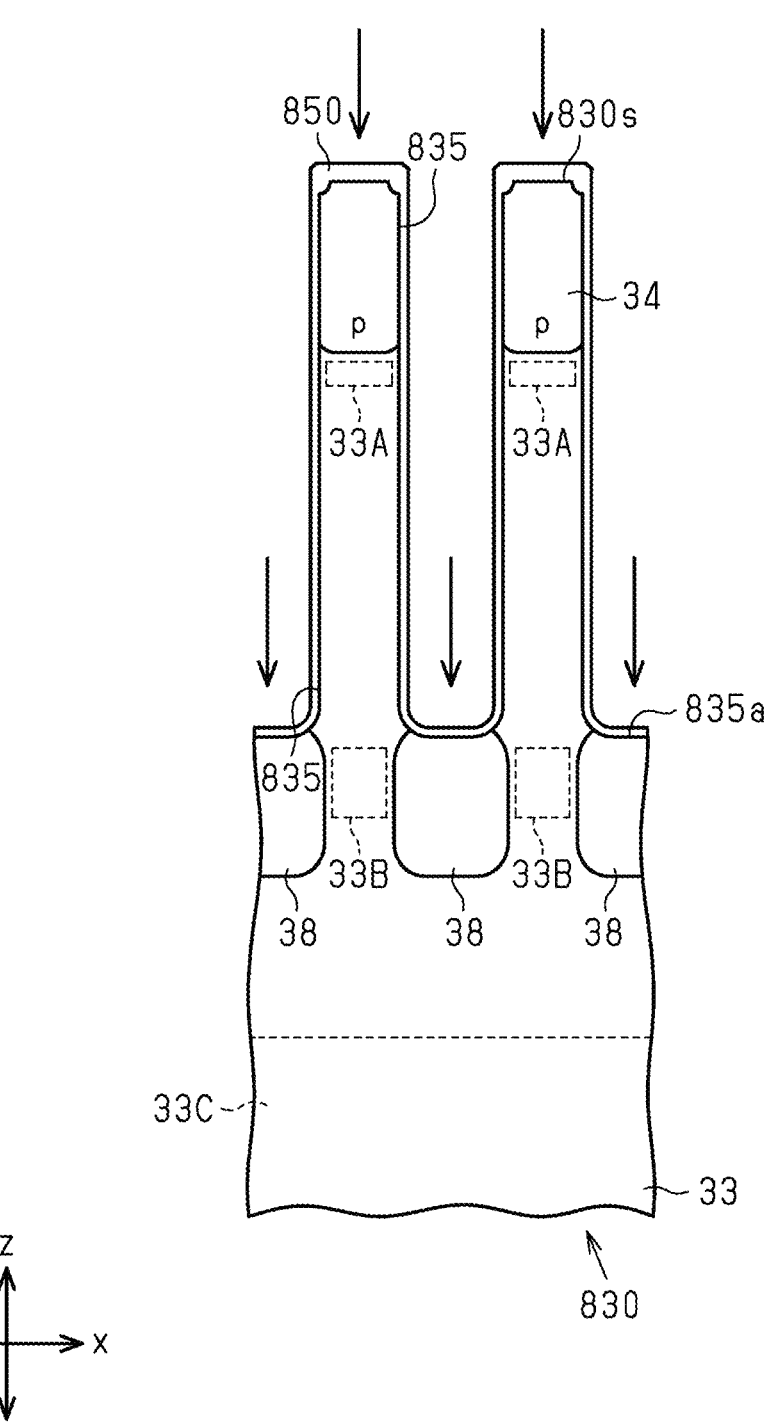
FIG. 7 is a diagram illustrating one example of a manufacturing step in the method for manufacturing the semiconductor device.

As shown in FIG. 7, the method for manufacturing the semiconductor device 10 of the present embodiment includes forming the base region 34 and the column region 38.

In this step, impurities of the second conductive type (p-type) are implanted into the drift layer 33 in the z-direction in the entire main cell region 11. This implants and disperses p-type impurities in the drift layer 33 between adjacent ones of the trenches 835 in the x-direction and forms the base region 34. Further, the p-type impurities are implanted from the trenches 835 into a bottom portion 835a of each trench 835 and dispersed to form the column region 38. The impurity concentration of the base region 34 is, for example, in a range of $1 \times 10^{16}$ cm$^{-3}$ to $1 \times 10^{18}$ cm$^{-3}$. The impurity concentration of the column region 38 is, for example, in a range of $1.0 \times 10^{15}$ cm$^{-3}$ to $5.0 \times 10^{17}$ cm$^{-3}$. Then, the sacrificial oxide film 850 is removed.

Figure 8:
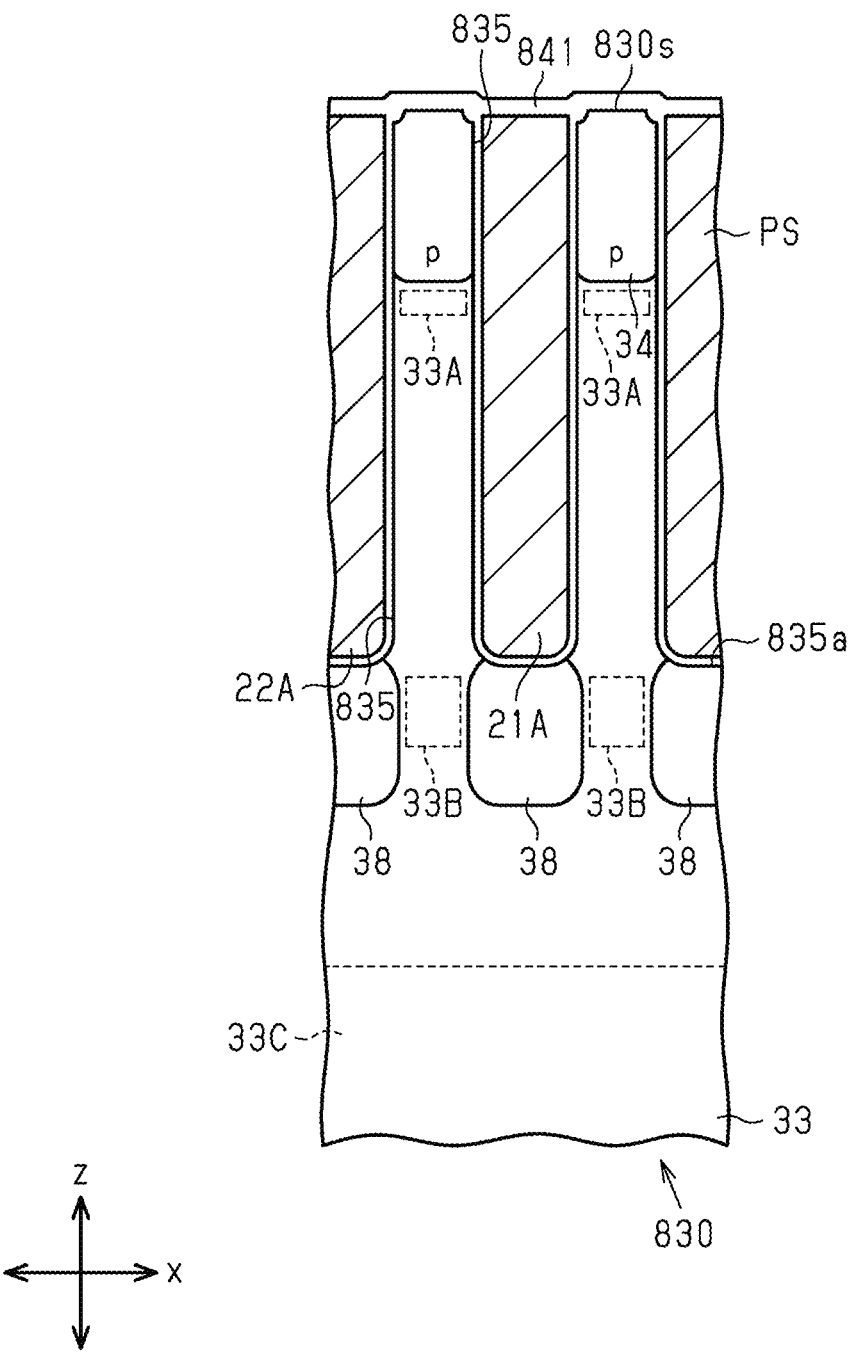
FIG. 8 is a diagram illustrating one example of a manufacturing step in the method for manufacturing the semiconductor device.

As shown in FIG. 8, the method for manufacturing the semiconductor device 10 of the present embodiment includes a step of forming an insulation film 841 and a step of forming an electrode.

In the step of forming the insulation film 841, the semiconductor substrate 830 is first thermally oxidized to form an oxide film on the entire top surface of the semiconductor substrate 830 including the wall surface of each trench 835. This forms the insulation film 841 on the substrate head surface 830s of the semiconductor substrate 830. The insulation film 841 corresponds to the insulation film 41. The insulation film 841 of the main cell region 11 (refer to FIG. 2) is a gate insulation film and also formed in the wall surface of each trench 835.

Then, in the step of forming an electrode, an electrode material PS of polysilicon or the like is embedded in each trench 835 and applied to the substrate head surface 830s of the semiconductor substrate 830. This forms the gate trenches 22A and the emitter trenches 21A.

Then, the electrode material PS is etched and removed from the substrate head surface 830s of the semiconductor substrate 830 in the main cell region 11. Further, the electrode material PS embedded in each trench 835 is oxidized. This forms the insulation film 841 on the electrode material PS.

Figure 9:
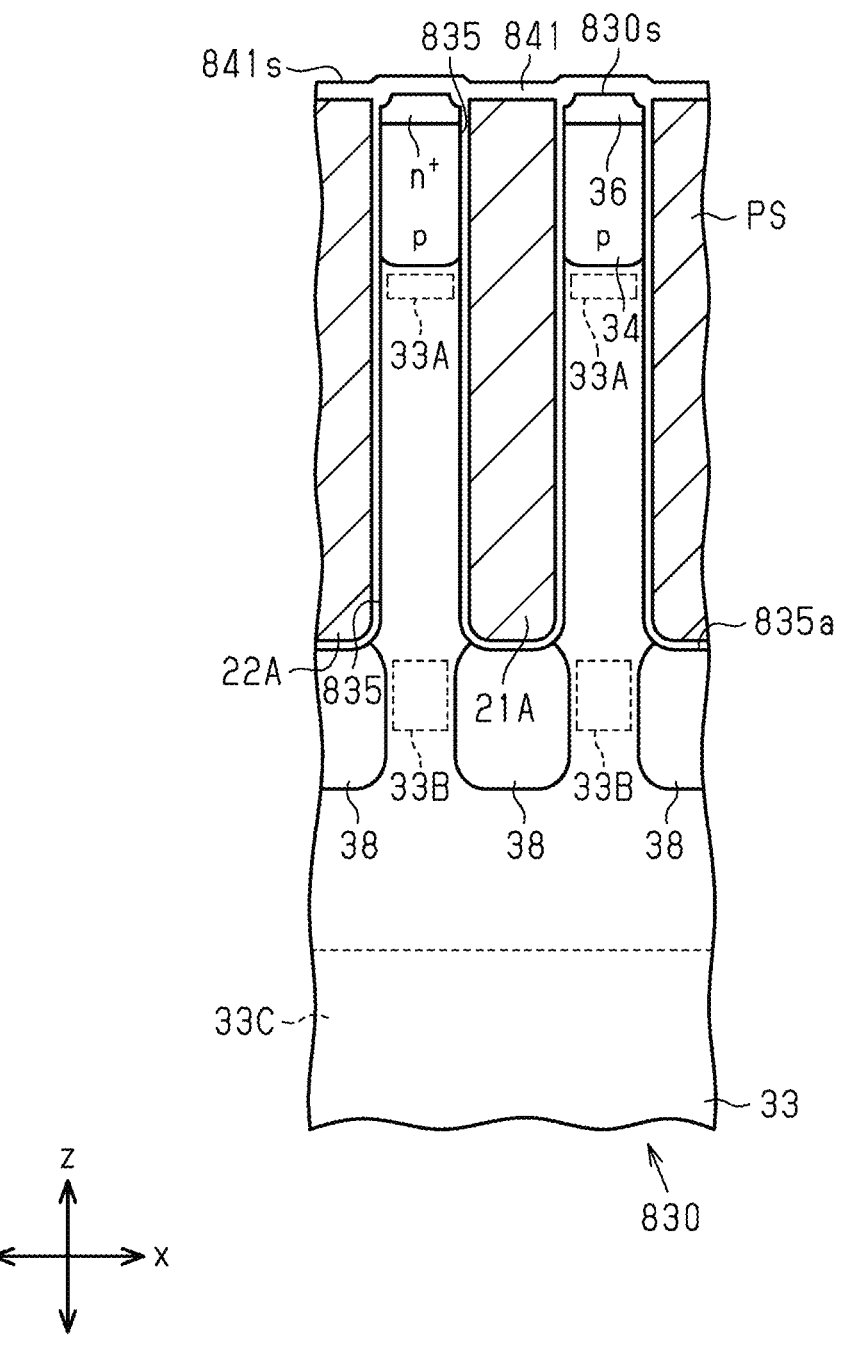
FIG. 9 is a diagram illustrating one example of a manufacturing step in a method for manufacturing the semiconductor device.

As shown in FIG. 9, the method for manufacturing the semiconductor device 10 of the present embodiment includes a step of forming the emitter regions 36. More specifically, ion implantation and dispersion of n-type impurities is selectively performed on the substrate head surface 830s of the semiconductor substrate 830 to form the n$^+$ type emitter regions 36. The impurity concentration of the emitter region 36, which is greater than that of the base region 34, is, for example, in a range of $1 \times 10^{19}$ cm$^{-3}$ to $5 \times 10^{20}$ cm$^{-3}$.

Figure 10:
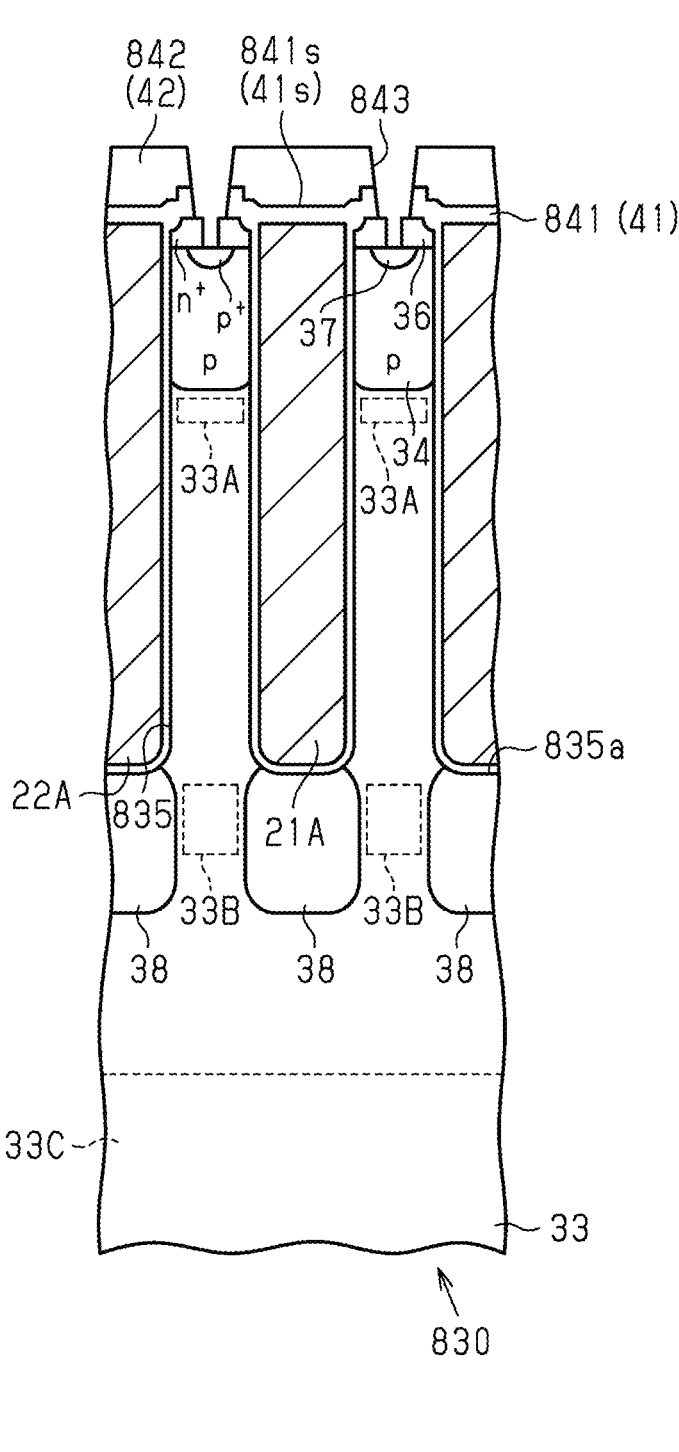
FIG. 10 is a diagram illustrating one example of a manufacturing step in the method for manufacturing the semiconductor device.

As shown in FIG. 10, the method for manufacturing the semiconductor device 10 of the present embodiment includes a method for forming an intermediate insulation film 842, a method for forming openings, and a method for forming the base contact regions 37.

The intermediate insulation film 842 is formed through, for example, chemical vapor deposition (CVD) on the entire substrate head surface 830s of the semiconductor substrate 830. The intermediate insulation film 842 is formed on a top surface 841s of the insulation film 841. The intermediate insulation film 842 corresponds to the intermediate insulation film 42. The intermediate insulation film 842 is formed on the insulation film 841. In this case, the insulation film covering the substrate head surface 830s of the semiconductor substrate 830 is a double-layer structure of the insulation film 841 and the intermediate insulation film 842 formed on the substrate head surface 830s of the semiconductor substrate 830.

Etching is performed to form openings 843 extending through each of the intermediate insulation film 842 and the insulation film 841. The openings 843 expose the base region 34. This forms the insulation film 41 and the intermediate insulation film 42.

Then, p-type dopants are ion-implanted and dispersed in the substrate head surface 830s of the semiconductor substrate 830 through the openings 843 to form the p$^+$ type base contact regions 37. The impurity concentration of each base contact region 37 is, for example, in a range of $5 \times 10^{18}$ cm$^{-3}$ to $1 \times 10^{20}$ cm$^{-3}$.

Figure 11:
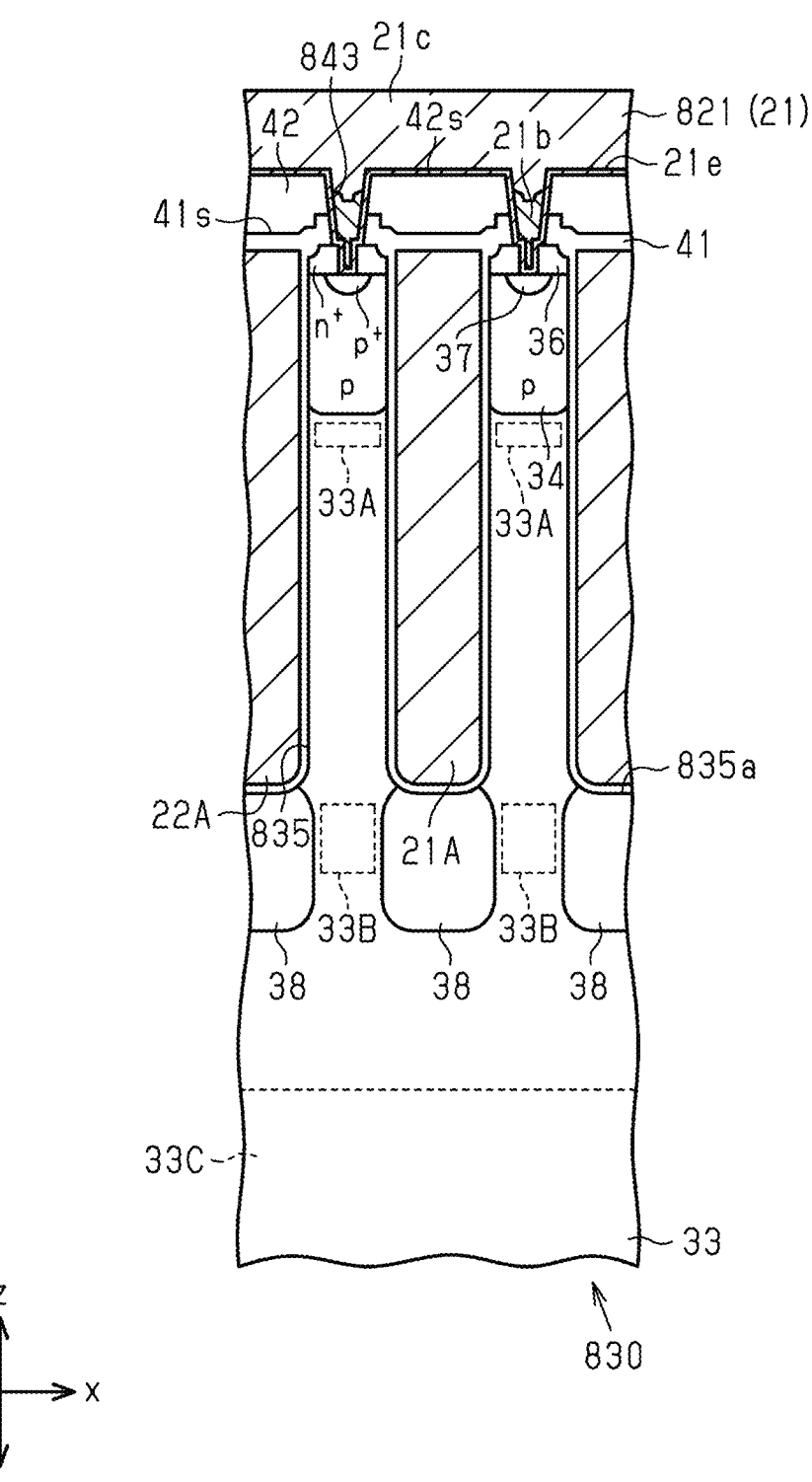
FIG. 11 is a diagram illustrating one example of a manufacturing step in the method for manufacturing the semiconductor device.

As shown in FIG. 11, the method for manufacturing the semiconductor device 10 of the present embodiment includes a step of forming the emitter electrode 21.

Sputtering is first performed with, for example, titanium (Ti) to form a first metal layer on the head surface 42s of the intermediate insulation film 42 and the wall surface of each opening 843. Then, sputtering is performed with titanium nitride (TiN) to form a second metal layer on the first metal layer. This forms the barrier metal layer 21e. Then, sputtering is performed with AlCu to form an electrode layer 821. The electrode layer 821 is formed on the entire intermediate insulation film 42 as viewed in the z-direction. Then, etching is performed on the electrode layer 821 to form the emitter electrode 21.

Although not shown in the drawings, the method for manufacturing the semiconductor device 10 of the present embodiment includes a step of forming the buffer layer 32, the collector layer 31, and the collector electrode 27. More specifically, n-type and p-type dopants are selectively ion-implanted and dispersed in the substrate back surface of the semiconductor substrate 830 to sequentially form the buffer layer 32 and the collector layer 31. Then, the collector electrode 27 is formed on the surface of the collector layer 31 that is opposite the buffer layer 32. The semiconductor device 10 is manufactured through the steps described above. FIGS. 5 to 11 show only some of the manufacturing steps of the semiconductor device 10. The method for manufacturing the semiconductor device 10 may include steps that are not shown in FIGS. 5 to 11.

Operation of Present Embodiment

The operation of the present embodiment will now be described with reference to FIGS. 3, 4, and 12 to 18.

Figure 12:
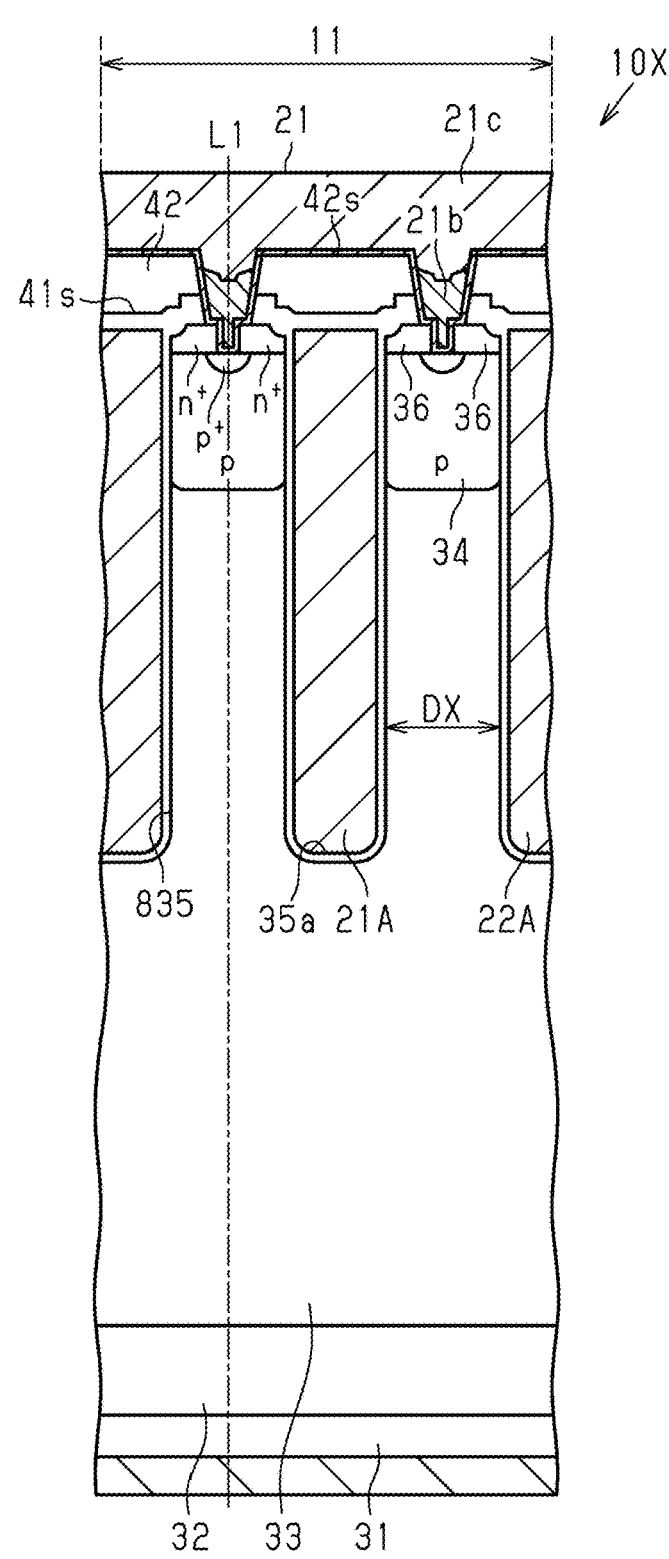
FIG. 12 is a cross-sectional view illustrating the structure of one example of a main cell region in a semiconductor device of experimental example 1.
Figure 12:
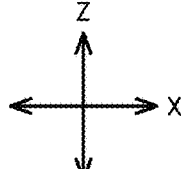
Figure 13:
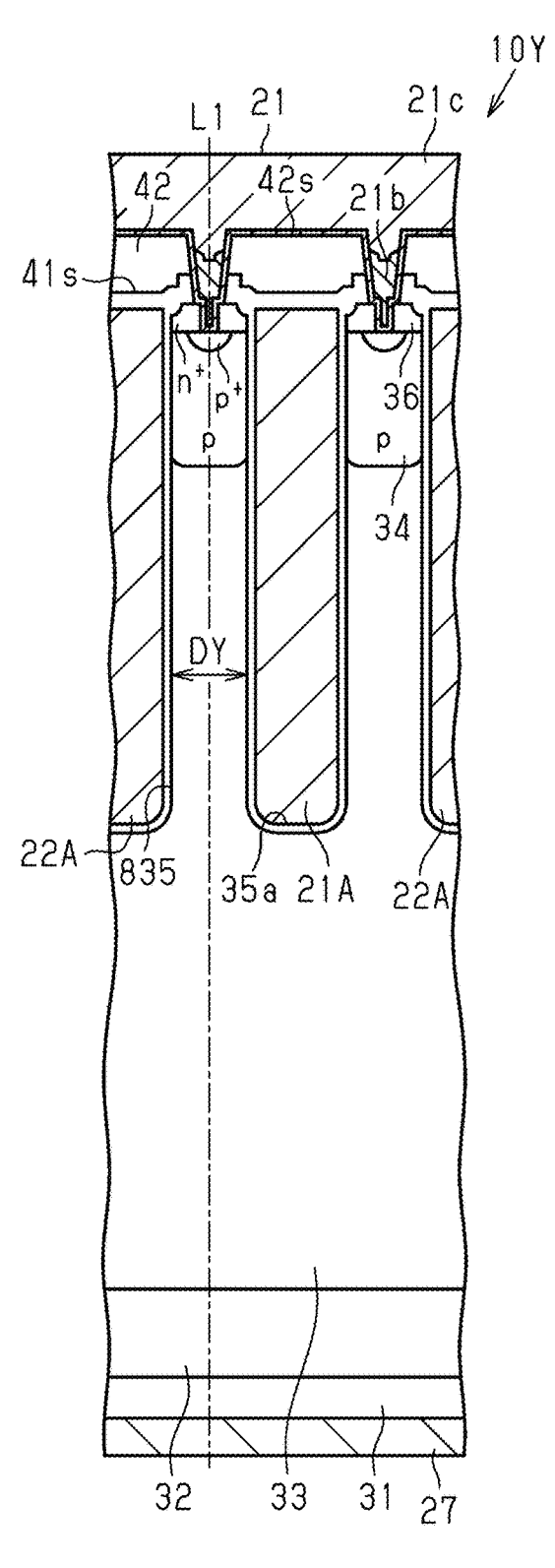
FIG. 13 is a cross-sectional view illustrating the structure of one example of a main cell region in a semiconductor device of experimental example 2.
Figure 13:
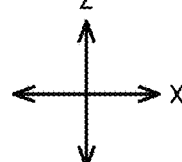

FIG. 12 shows the cross-sectional structure of the main cell region 11 in a semiconductor device 10X of experimental example 1. FIG. 13 shows the cross-sectional structure of the main cell region 11 in a semiconductor device 10Y of experimental example 2. Graph GR of the broken lines in FIG. 4 shows the impurity concentration distribution at the first straight line L1 in the semiconductor devices 10X and 10Y The semiconductor device 10 of the present embodiment will be referred to as experimental example 3.

With reference to FIGS. 4, 12, and 13, the semiconductor devices 10X and 10Y differ from the semiconductor device 10 in that the column region 38 is omitted, and the second region 33B and the third region 33C are omitted from the drift layer 33. The trenches 35 of the semiconductor device 10Y are arranged at a narrower pitch than the semiconductor device 10X. The distance DY in the x-direction between adjacent ones of the trenches 35 in the semiconductor device 10Y is equal to the distance D (refer to FIG. 3) in the x-direction between adjacent ones of the trenches 35 in the semiconductor device 10 of the present embodiment. Thus, the distance DX in the x-direction between adjacent ones of the trenches 35 in the semiconductor device 10X is greater than the distance D in the x-direction between adjacent ones of the trenches 35 in the semiconductor device 10 of the present embodiment. The area of the main cell region 11 as viewed in the z-direction is the same in the semiconductor devices 10, 10X, and 10Y Thus, the number of main cells in the semiconductor device 10X is less than the number of main cells in the semiconductor devices 10 and 10Y.

As shown in graph GR of FIG. 4, the first region 33A of the drift layer 33 in the semiconductor devices 10X and 10Y has the first concentration peak CP1 at depth HA in the same manner as the semiconductor device 10. In the first region 33A of the semiconductor devices 10X and 10Y, the decreasing rate of the impurity concentration from the first concentration peak CP1 toward deeper positions is greater than that of the first region 33A in the semiconductor device 10. The impurity concentration at depth HT, which is shallower than the bottom portion 35a of the trench 35, is, for example, $1\times10^{14}$ cm$^{-3}$. In the semiconductor devices 10X and 10Y, the impurity concentration at depth HT, which is shallower than the bottom portion 35a of the trench 35, is the same as the impurity concentration at depth H6 in the semiconductor device 10. In the region of the drift layer 33 from depth HT and deeper in the semiconductor devices 10X and 10Y, the impurity concentration is, for example, $1\times10^{14}$ cm$^{-3}$. More specifically, the impurity concentration in the region between the first region 33A and the second region 33B in the semiconductor device 10 is greater than the impurity concentration in the region of the drift layer 33 deeper than depth HT in the semiconductor devices 10X and 10Y Further, the impurity concentration in the region of the semiconductor device 10 between the first region 33A and the second region 33B is greater than the impurity concentration in the regions of the semiconductor devices 10X and 10Y corresponding to between the first region 33A and the second region 33B (region in semiconductor devices 10X and 10Y from a position deeper than depth H3 to depth H4). Further, the difference in the impurity concentration in the region of the semiconductor device 10 between the first region 33A and the second region 33B and the impurity concentration in the regions of the semiconductor device 10X and 10Y from a position deeper than depth H3 to depth H4 increases from depth H3 toward depth H4.

Figure 14:
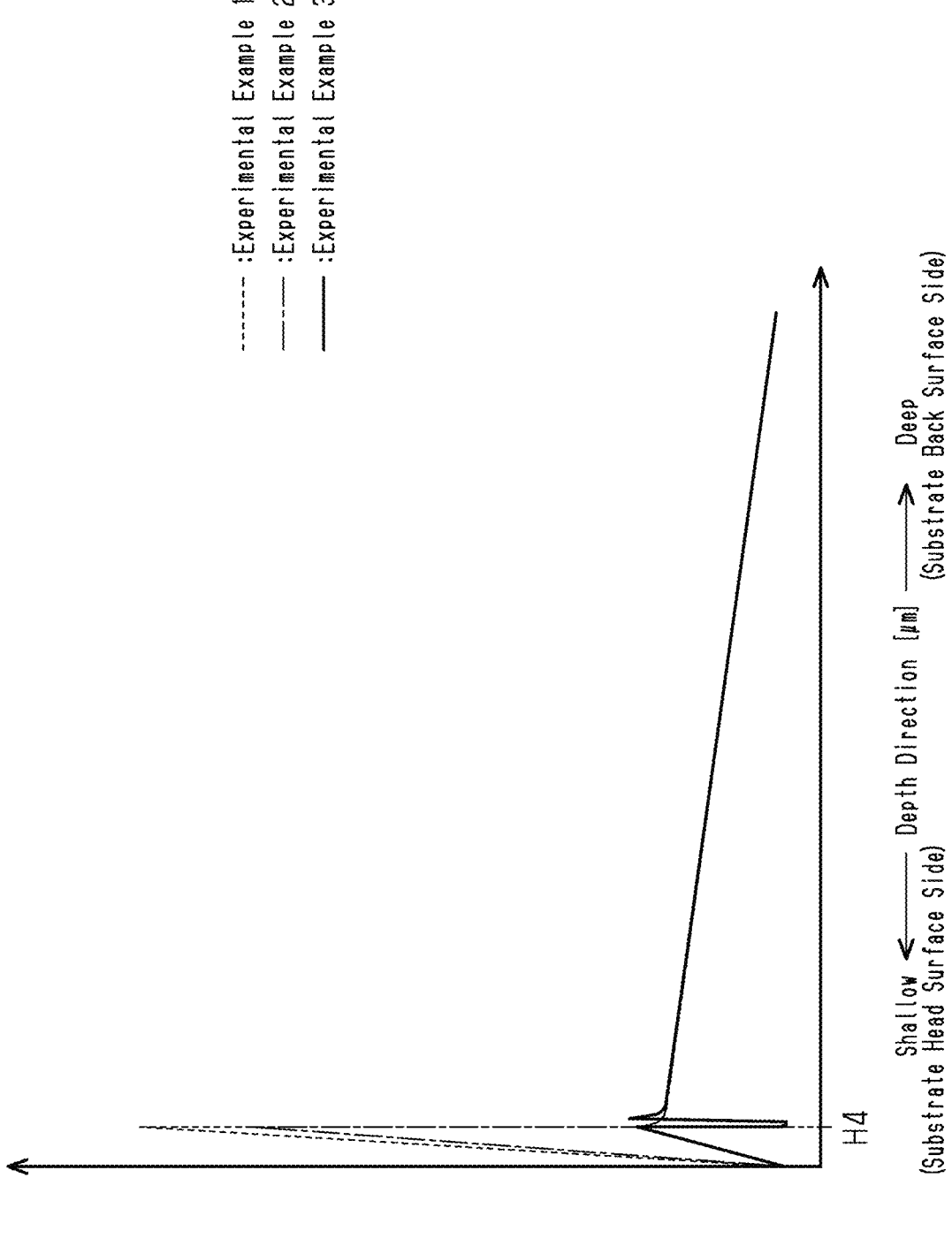
FIG. 14 is a graph illustrating the relationship of the drift layer depth and electric field intensity in the semiconductor device.

FIG. 14 is a graph illustrating the electric field intensity of the drift layer 33 at different positions of the drift layer 33 in the z-direction in experimental examples 1 to 3. FIG. 14 shows the simulation result when applying a voltage of 1000 V between the collector and the emitter in a state in which the collector and the emitter is short-circuited.

As shown in FIG. 14, the electric field intensity at depth H4, which corresponds to the bottom portion 35a of the trench 35, is lower in experimental example 3 than experimental examples 1 and 2. More specifically, in experimental example 3, the column region 38 is located at the bottom portion 35a of the trench 35. This reduces the electric field concentrated at the bottom portion 35a of the trench 35. In experimental examples 1 and 2, the column region 38 is not formed at the bottom portion 35a of the trench 35. Thus, electric field is concentrated at the bottom portion 35a of the trench 35.

Figure 15:
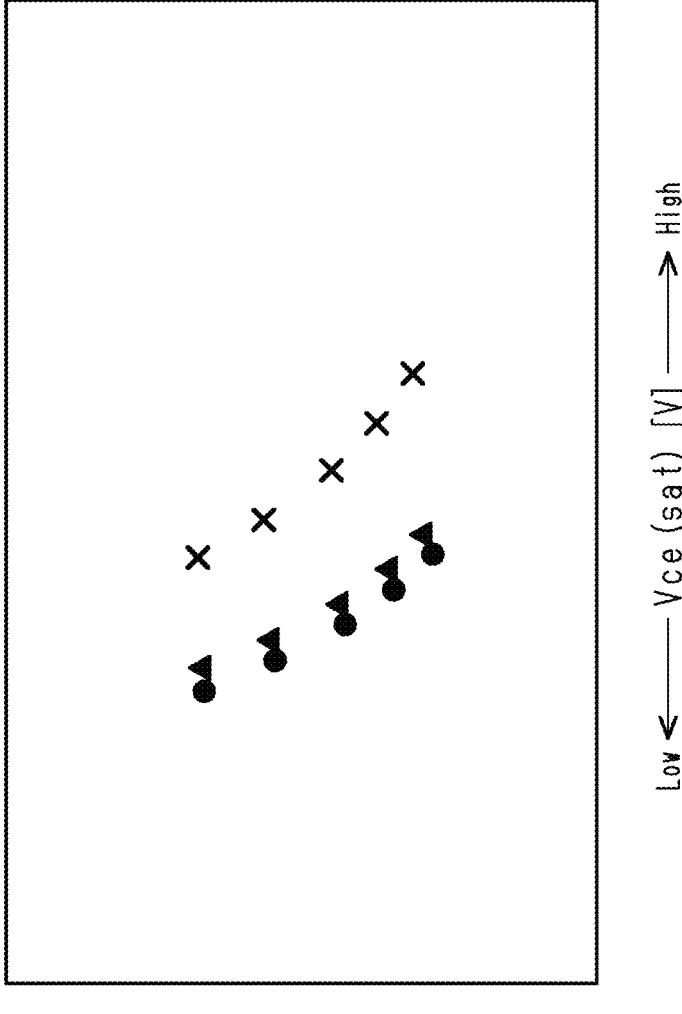
FIG. 15 is a graph illustrating the relationship of the collector-emitter saturation voltage and loss when the semiconductor device is turned off.

FIG. 15 is a graph illustrating the relationship of collector-emitter saturation voltage Vce(sat) and loss Eoff when the semiconductor device is turned off in experimental examples 1 to 3.

As shown in FIG. 15, when the loss Eoff is the same during a turn-off, the collector-emitter saturation voltage Vce(sat) is lower in experimental example 3 than in experimental examples 1 and 2. Thus, the loss Eoff in the collector-emitter voltage Vce during a turn-off is lower in experimental example 3 than in experimental examples 1 and 2. This allows experimental example 3 to be designed so that the loss Eoff and the collector-emitter saturation voltage Vce (sat) are both lower during a turn-off than experimental examples 1 and 2.

Figure 16:
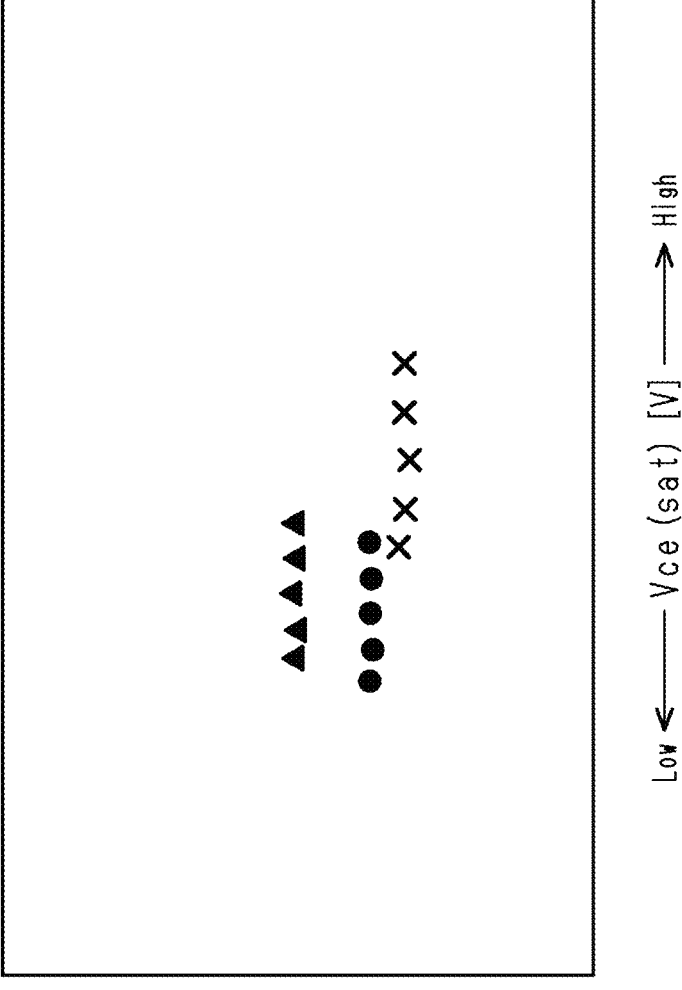

FIG. 16 is a graph illustrating the relationship of collector-emitter saturation voltage Vce(sat) and loss Eon when the semiconductor device is turned on in experimental examples 1 to 3.

As shown in FIG. 16, when the collector-emitter saturation voltage Vce(sat) is the same, the loss Eon in experimental example 3 is higher than in experimental example 1 and lower than in experimental example 2. It is understood that this is because the greater number of the main cells 11A in experimental examples 2 and 3 than experimental example 1 increases the Miller capacitance. In experimental example 3, the column region 38 is located at the bottom portion 35a of the trench 35. This limits increases in the Miller capacitance. Thus, when the collector-emitter saturation voltage Vce(sat) is the same, the loss Eon is smaller in experimental example 3 than in experimental example 2.

Figure 17:
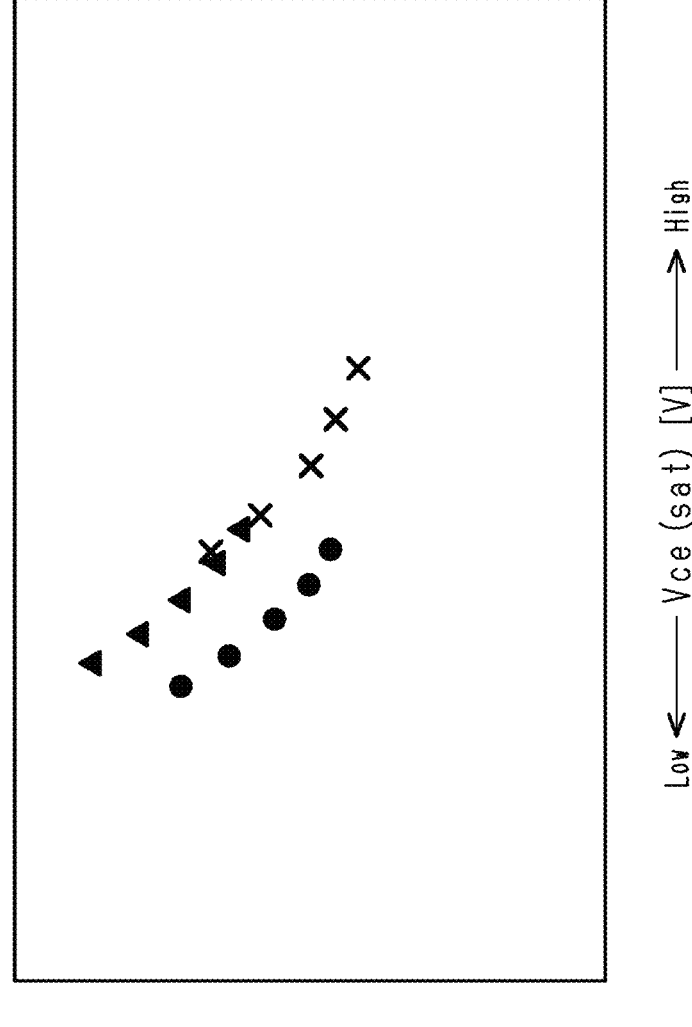

FIG. 17 is a graph illustrating the relationship of collector-emitter saturation voltage Vce(sat) and total loss (hereafter, loss Etotal) in experimental examples 1 to 3. The loss Etotal is the total of the loss Eoff during a turn-off and the loss Eon during a turn-on.

As shown in FIG. 17, when the loss Etotal is the same, the collector-emitter saturation voltage Vce(sat) is lower in experimental example 3 than in experimental examples 1 and 2. The loss Etotal with respect to the collector-emitter voltage Vce is lower in experimental example 3 than in experimental examples 1 and 2. This allows experimental example 3 to be designed so that the loss Etotal and the collector-emitter saturation voltage Vce(sat) are both lower than experimental examples 1 and 2.

Figure 18:
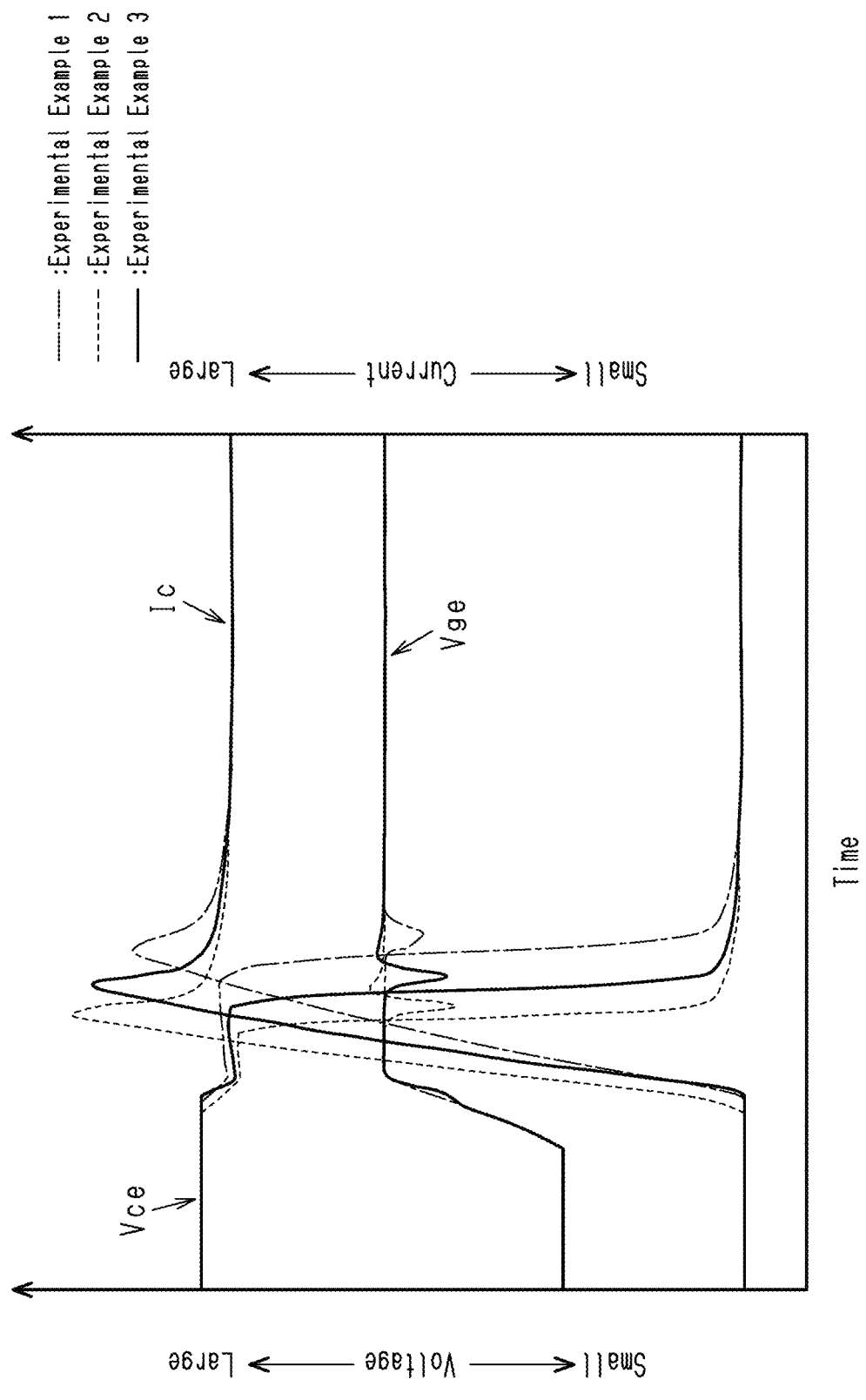
FIG. 18 is a graph illustrating the relationship of the collector-emitter saturation voltage and loss when the semiconductor device is driven.

FIG. 18 is a graph illustrating the collector current Ic, the collector-emitter voltage Vce, and the gate-emitter voltage Vge when the semiconductor devices of experimental examples 1 to 3 are turned on. The graph in broken lines represent experimental example 1, the graph in single-dashed lines represent experimental example 2, and the graph in solid lines represent experimental example 3.

As shown in FIG. 16, miniaturization increases the number of the main cells 11A. This increases the Miller capacitance and increases the loss Eon during a turn on. Thus, as shown in FIG. 18, the rising speed of current in experimental example 2 during a turn-on is lower than the rising speed of current in experimental example 1. Experimental example 3 includes the column region 38 located at the bottom portion 35a of the trench 35. This limits increases in the Miller capacitance. Thus, the rising speed of current in experimental example 3 during a turn-off is lower than the rising speed of current in experimental example 1 but higher than the rising speed of current in experimental example 2.

ADVANTAGES OF PRESENT EMBODIMENT

The semiconductor device 10 of the present embodiment has the advantages described below.

(1) The semiconductor device 10 includes the drift layer 33 of the first conductive type (n-type), the base region 34 of the second conductive type (p-type) formed in the drift layer 33 at the side closer to the head surface, the trenches 35 extending through the base region 34 to the drift layer 33 in the depth direction (z-direction), the insulation film 41 formed on the wall surfaces of the trenches 35, the gate trenches 22A surrounded by the insulation film 41, and the column regions 38 of the second conductive type (p-type) located at the bottom portions 35a of the trenches 35 in the drift layer 33. The drift layer 33 includes the first region 33A, which has the first concentration peak CP1, and the second region 33B, which has the second concentration peak CP2 that is lower than the first concentration peak CP1. The second region is located at a position corresponding to the column regions 38 that is deeper than the trenches 35.

In this configuration, the column region 38 is located at the bottom portion 35a of each trench 35. This reduces the electric field concentrated at the bottom portion 35a of the trench 35. Thus, even if miniaturization results in an increase in the number of the main cells 11A, increases in the Miller capacitance will be limited. Accordingly, the semiconductor device 10 increases the breakdown voltage and decreases the on-resistance.

Miniaturization will decrease the distance between adjacent ones of the column regions 38 in the arrangement direction of the trenches 35 (x-direction). This may join the column regions 38. When adjacent column regions 38 are joined, the current flowing from the collector electrode 27 to the emitter electrode 21 will have to pass through the column regions 38. This will hinder the flow of current from the collector electrode 27 to the emitter electrode 21.

In the semiconductor device 10 of the present embodiment, the second region 33B, which has the second concentration peak CP2, is located in the drift layer 33 at the position corresponding to the column region 38. Thus, the impurity concentration of the second region 33B is relatively high. This limits expansion of the column regions 38 in the arrangement direction of the trenches 35 (x-direction) when forming the column regions 38. As a result, the joining of adjacent ones of the column regions 38 in the arrangement direction of the trenches 35 can be avoided.

(2) The column regions 38 are arranged in correspondence with the trenches 35. In this configuration, the concentration of an electric field is decreased at the bottom portion 35a of each trench 35. This allows the breakdown voltage of the semiconductor device 10 to be increased.

(3) The second regions 33B of the drift layer 33 are located between adjacent ones of the column regions 38 in the arrangement direction of the trenches 35 (x-direction).

In this configuration, expansion of the column regions 38 in the arrangement direction of the trenches 35 (x-direction) will be limited when forming the column regions 38. Thus, the joining of adjacent ones of the column regions 38 in the arrangement direction of the trenches 35 can be avoided.

(4) The second regions 33B in the drift layer 33 each include a portion located at position corresponding to the column regions 38 in the depth direction of the trenches 35 (z-direction).

In this configuration, the formation of the column regions 38 further limits expansion of the column regions 38 in the arrangement direction of the trenches 35 (x-direction). This further avoids joining of the column regions 38 in the arrangement direction of the trenches 35.

(5) The column regions 38 are each formed to entirely cover the bottom portion 35a of the corresponding trench 35.

In this configuration, the concentration of an electric field is further decreased at the bottom portion 35a of the trench 35.

(6) The distance D between adjacent ones of the trenches 35 in the arrangement direction of the trenches 35 (the x-direction) is less than or equal to the width Wt of the trenches 35.

This configuration allows the number of the main cells 11A to be increased when the chip size is the same. However, this will decrease the distance between the trenches 35 and may result in the column regions 38 being joined with each other.

In this regard, in the present embodiment, as described above, the second region 33B limits expansion of the column regions 38. Thus, even if the distance between the trenches 35 is decreased, the column regions 38 will not be joined with one another. This allows for further integration of the main cells 11A and avoids joining of the column regions 38.

MODIFIED EXAMPLES

The embodiment described above exemplifies, without any intention to limit, an applicable form of a semiconductor device according to this disclosure. The semiconductor device in accordance with this disclosure may be modified from the embodiment described above. For example, the configuration in the above embodiment may be replaced, changed, or omitted in part or include an additional element. The modified examples described below may be combined as long as there is no technical contradiction. In the modified examples described hereafter, same reference characters are given to those components that are the same as the corresponding components of the above embodiments. Such components will not be described in detail.

In the above embodiment, the semiconductor device 10 may include the main cell region 11, which forms an IGBT, and a diode cell region 14, which forms a freewheeling diode connected to the IGBT. Four patterns of the semiconductor device 10 including the diode cell region 14, that is, a reverse conducting (RC)-IGBT, will now be described with reference to FIGS. 19 to 22. The differences of the modified examples the semiconductor device 10 shown in FIGS. 20 to 22 from the modified example of the semiconductor device 10 shown in FIG. 19 will now be described.

Figure 19:
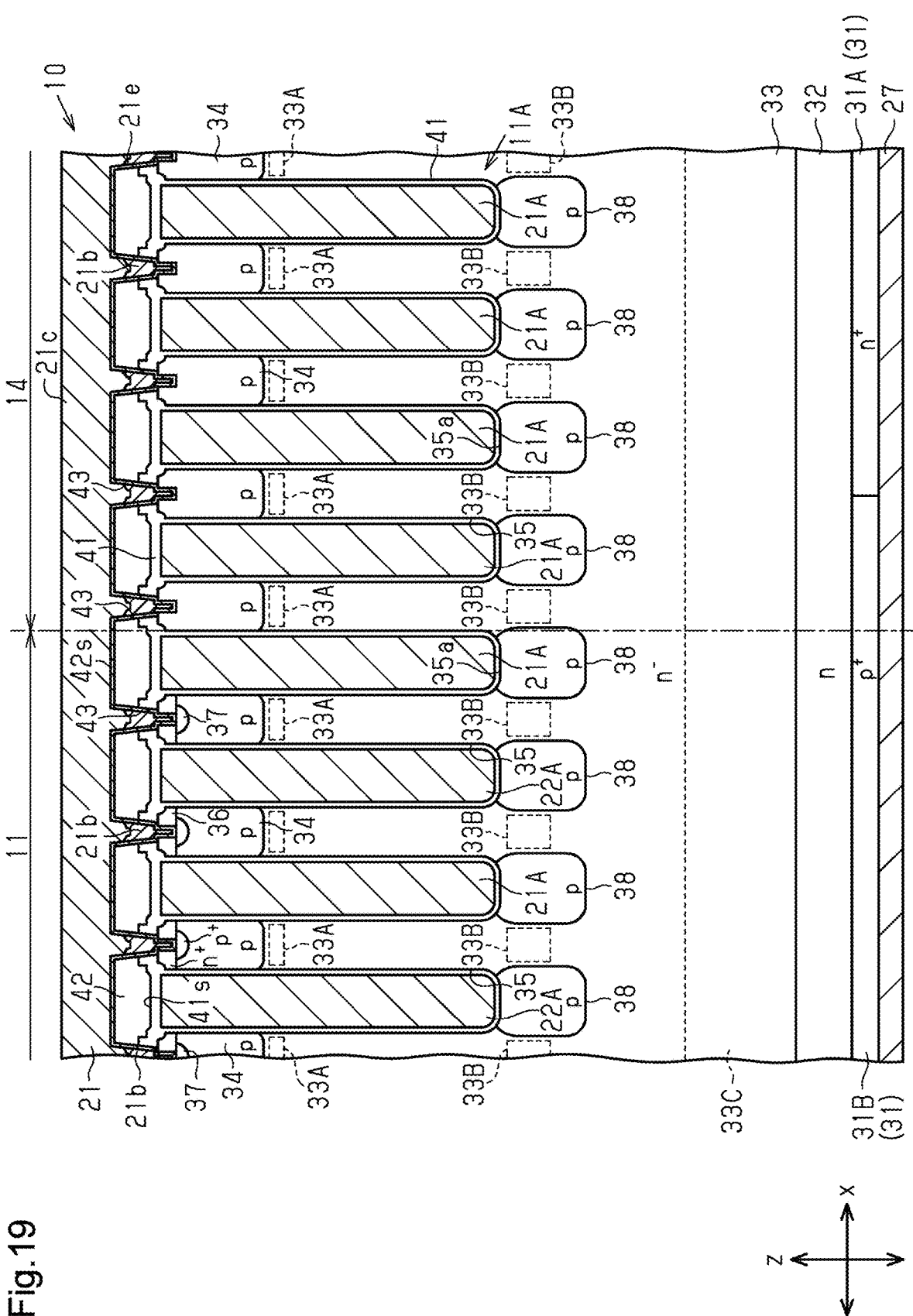
FIG. 19 is a cross-sectional view illustrating the structure of one example of a main cell region and a diode cell region in a semiconductor device of a modified example.

In FIG. 19, the trenches 35 are formed in both of the main cell region 11 and the diode cell region 14. In the main cell region 11 of the illustrated example, the emitter trenches 21A and the gate trenches 22A are arranged alternately in the arrangement direction of the trenches 35 (x-direction). In the illustrated example, an emitter trench 21A is located at the end of the main cell region 11 that is adjacent to the diode cell region 14. The diode cell region 14 includes the emitter trenches 21A but not the gate trenches 22A.

In the illustrated example, the column region 38 is located at the bottom portion 35a of each trench 35 in both of the main cell region 11 and the diode cell region 14. Thus, the column region 38 is located at the bottom portion 35a of each trench 35 formed in the main cell region 11 and at the bottom portion 35a of each trench 35 formed in the diode cell region 14.

The base region 34 is formed in the head surface of the drift layer 33 in both of the main cell region 11 and the diode cell region 14. In the same manner as the above embodiment, the main cell region 11 includes the emitter regions 36 and the base contact regions 37. The diode cell region 14 does not include the emitter regions 36 and the base contact regions 37. Thus, the emitter regions 36 and the base contact regions 37 are selectively formed on the base regions 34 of the main cell region 11 but not on the base region 34 of the diode cell region 14.

The collector layer 31 includes a first collector region 31A of the first conductive type (n-type) and a second collector region 31B of the second conductive type (p-type). The first collector region 31A is formed in the diode cell region 14. The second collector region 31B is formed throughout the entire main cell region 11. Further, the second collector region 31B is formed in part of the diode cell region 14. Thus, the diode cell region 14 is formed in two regions, namely, the first collector region 31A and the second collector region 31B.

The insulation film 41 and the intermediate insulation film 42 both cover the main cell region 11 and the diode cell region 14. The insulation film 41 and the intermediate insulation film 42 both include the contact holes 43 that extend through the insulation film 41 and the intermediate insulation film 42. The contact holes 43 are located at positions corresponding to the main cell region 11 and positions corresponding to the diode cell region 14.

The emitter electrode 21 is formed covering both of the main cell region 11 and the diode cell region 14. The barrier metal layer 21e of the emitter electrode 21 is formed on the wall surfaces of the contact holes 43 and the head surface 42s of the intermediate insulation film 42 in both of the main cell region 11 and the diode cell region 14. The electrode main portion 21c and the embedded electrode portions 21b of the emitter electrode 21 are formed on the barrier metal layer 21e. The electrode main portion 21c is formed on the barrier metal layer 21e, which is formed on the head surface 42s of the intermediate insulation film 42 covering both of the main cell region 11 and the diode cell region 14. The embedded electrode portions 21b are embedded in the contact holes 43 of both of the main cell region 11 and the diode cell region 14.

Figure 20:
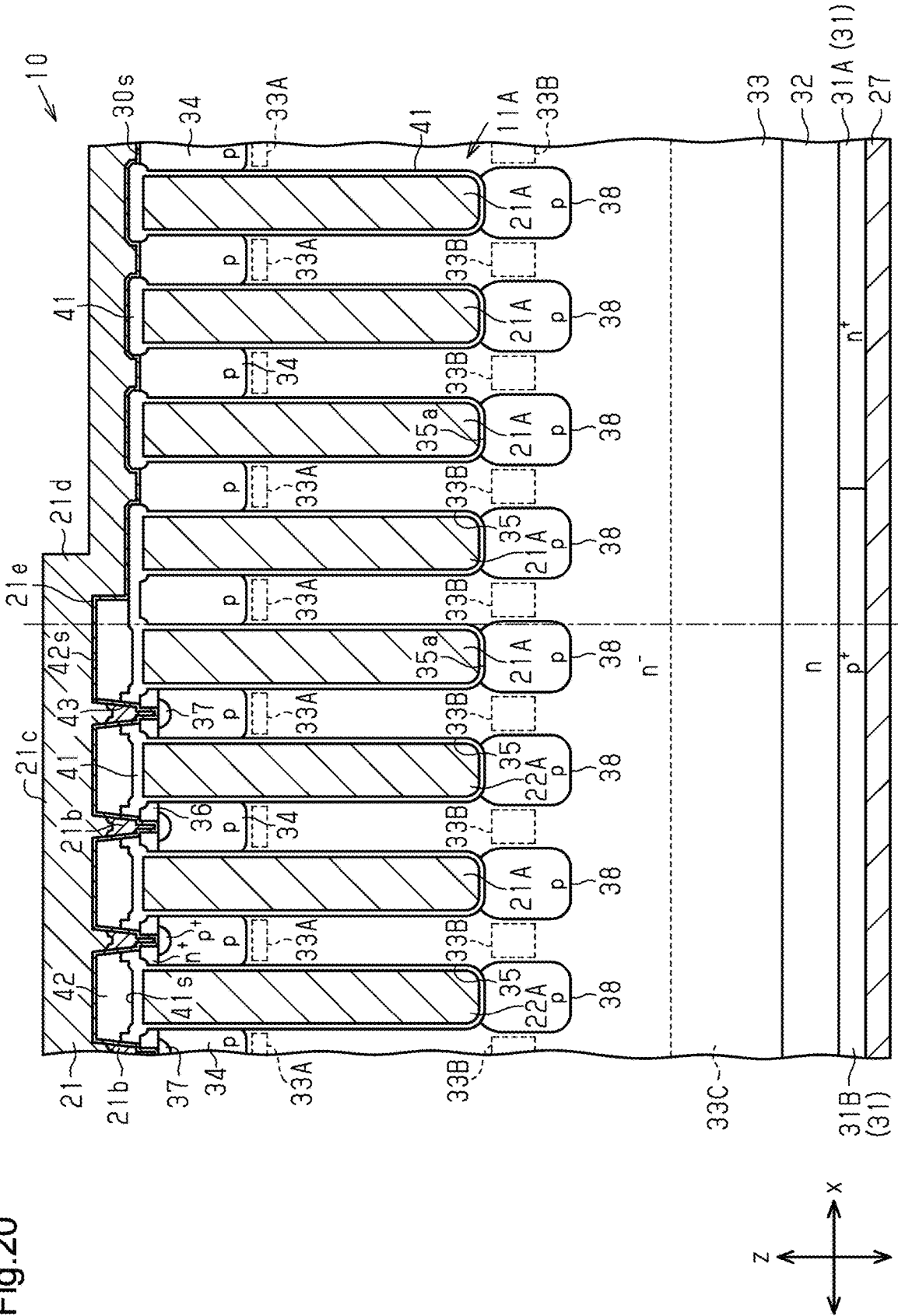
FIG. 20 is a cross-sectional view illustrating the structure of one example of a main cell region and a diode cell region in a semiconductor device of a modified example.

The modified example of the semiconductor device 10 illustrated in FIG. 20 differs from the semiconductor device 10 illustrated in FIG. 19 in that the diode cell region 14 does not include the intermediate insulation film 42 and the insulation film 41 at parts of the substrate head surface 30s separated from the emitter trenches 21A. Accordingly, the diode cell region 14 does not include the contact holes 43. Thus, the emitter electrode 21 does not include the embedded electrode portions 21b at where it covers the diode cell region 14. The embedded electrode portions 21b are selectively formed in the part of the emitter electrode 21 corresponding to the main cell region 11 but not in the part of the emitter electrode 21 corresponding to the diode cell region 14. The emitter electrode 21 includes a step 21d. The step 21d is formed at the end of the diode cell region 14 bordering the main cell region 11. In the part of the emitter electrode 21 corresponding to the diode cell region 14, the barrier metal layer 21e is formed on the substrate head surface 30s, and the electrode main portion 21c is formed on the barrier metal layer 21e.

Figure 21:
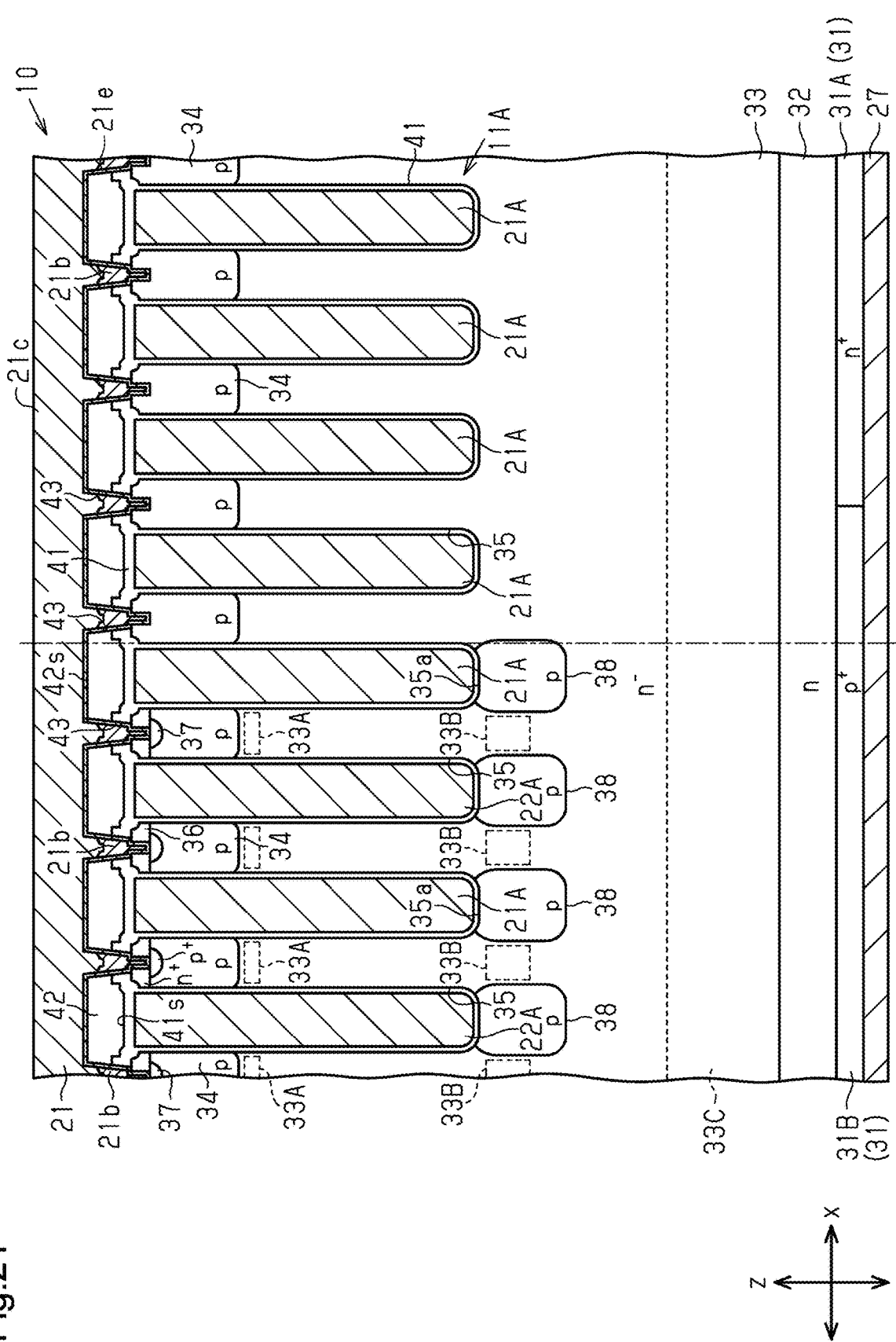
FIG. 21 is a cross-sectional view illustrating the structure of one example of a main cell region and a diode cell region in a semiconductor device of a modified example.

The modified example of the semiconductor device 10 illustrated in FIG. 21 differs from the semiconductor device 10 illustrated in FIG. 19 in that the diode cell region 14 that does not include the column region 38 at the bottom portion 35a of each trench 35. Accordingly, the drift layer 33 corresponding to the diode cell region 14 does not include the first region 33A and the second region 33B. Thus, the first region 33A and the second region 33B are selectively formed in the drift layer 33 that corresponds to the main cell region 11 and not in the drift layer 33 that corresponds to the diode cell region 14.

Figure 22:
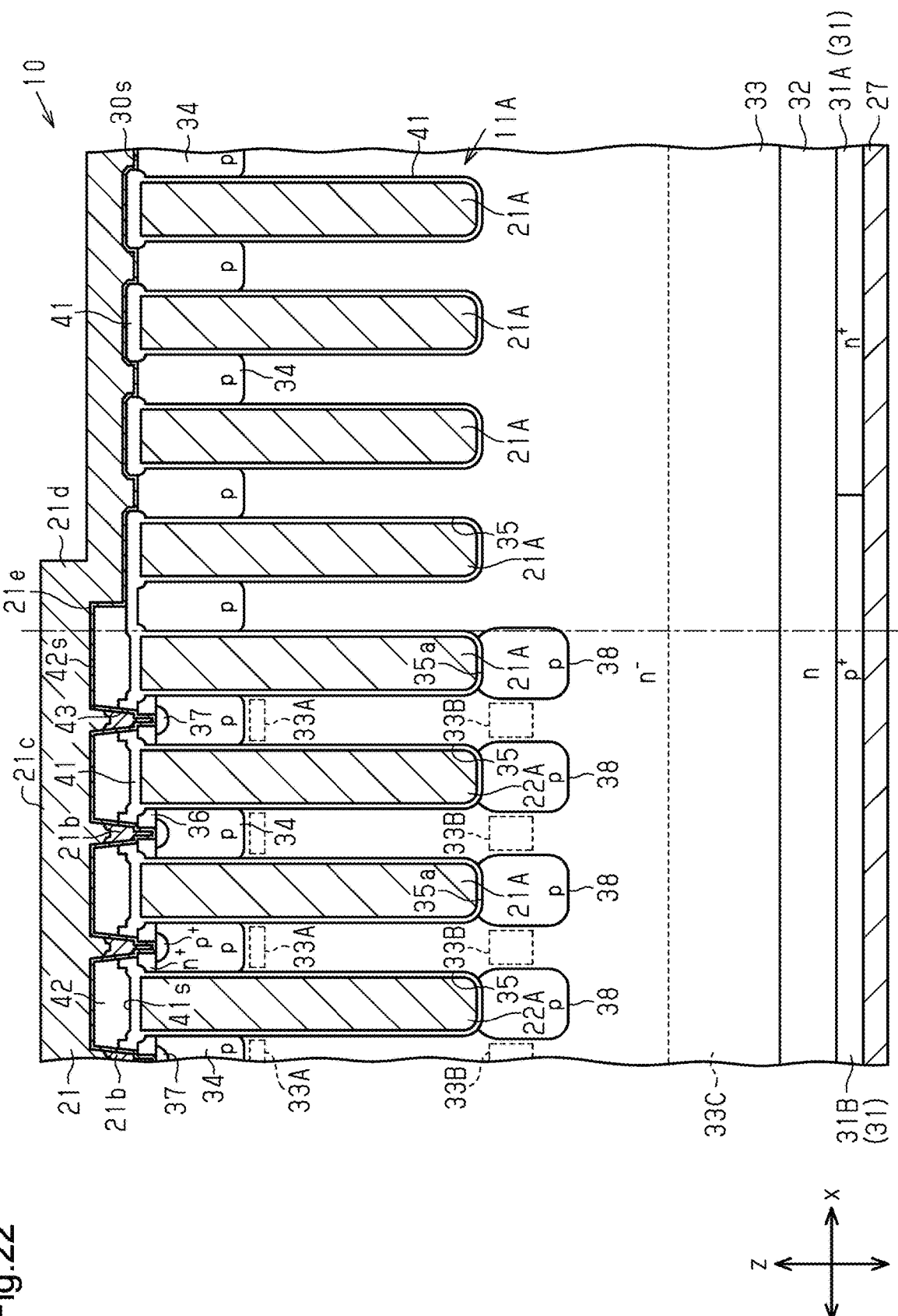
FIG. 22 is a cross-sectional view illustrating the structure of one example of a main cell region and a diode cell region in a semiconductor device of a modified example.

The modified example of the semiconductor device 10 illustrated in FIG. 22 differs from the semiconductor device 10 illustrated in FIG. 21 in that the diode cell region 14 does not include the intermediate insulation film 42 and that the diode cell region 14 does not include the insulation film 41 at parts of the substrate head surface 30s separated from the emitter trenches 21A. The emitter electrode 21 has the same structure as the emitter electrode 21 of FIG. 20.

Figure 23:
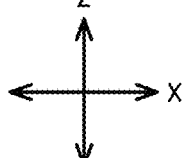
FIG. 23 is a cross-sectional view illustrating the structure of one example of a main cell region and the surrounding region in a semiconductor device of a modified example.

As shown in FIG. 23, the semiconductor device 10 of the above embodiment may include the floating regions 50 of the second conductive type (p-type) surrounding the main cell region 11. The floating regions 50 are in an electrically floating state. The floating regions 50 are deeper than the trenches 35. The emitter trenches 21A located at the two ends of the main cell region 11 in the arrangement direction of the trenches 35 are not the main cells 11A. In these emitter trenches 21A, the floating regions 50 cover the bottom portions 35a of the trenches 35. In the illustrated example, the floating regions 50 partially covers the bottom portions 35a of the trenches 35 corresponding to these emitter trenches 21A. The floating regions 50 may be formed to entirely cover the bottom portions 35a of the trenches 35 corresponding to these emitter trenches 21A.

Figure 24:
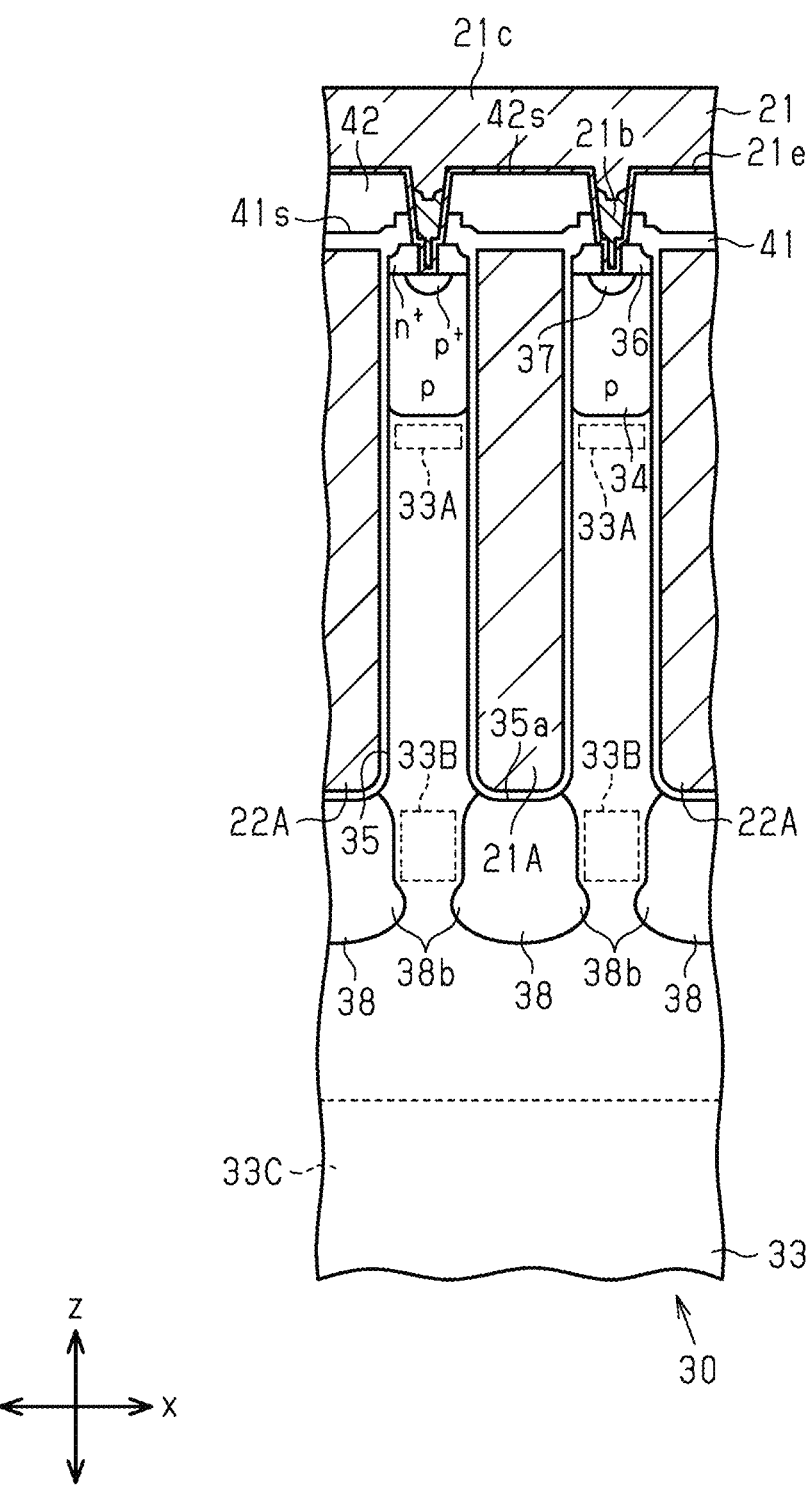
FIG. 24 is a cross-sectional view illustrating the structure of one example of a main cell region in a semiconductor device of a modified example.

In the above embodiment, the column region 38 may have any shape in a cross section taken along the depth direction of the trenches 35 and the arrangement direction of the trenches 35. That is, the column region 38 may have any shape in a cross section taken along the z-direction and the x-direction in the present embodiment. In one example, as shown in FIG. 24, the column region 38 may include a projecting region 38b that becomes wider in the x-direction as the bottom portion 35a of the trench 35 becomes farther and the substrate back surface 30r becomes closer in the z-direction.

In the above embodiment, the column regions 38 are separated from the base regions 34 in the z-direction. However, the column regions 38 do not have to be separated from the base regions 34 in the Z-direction. The column regions 38 may be formed in any range. In one example, the column regions 38 are connected to the base regions 34. More specifically, the column regions 38 each include a first column region, which is arranged in the drift layer 33 where the bottom portion 35a of the trench 35 is located, and a second column region, which extends from the first column region along the side surface of the corresponding trench 35 toward the base region 34. The second column region is a connecting region connecting the first column region and the base region 34. The second column regions extend in, for example, the depth direction of the trenches 35 (z-direction in above embodiment). Two second column regions formed between adjacent ones of the trenches 35 in the arrangement direction of the trenches 35 are separated from each other in the arrangement direction of the trenches 35. The drift layer 33 is formed between two second column regions in the arrangement direction of the trenches 35.

In the above embodiment, the column region 38 covers the entire bottom portion 35a of the trench 35 but does not have to cover the entire bottom portion 35a. In one example, the column region 38 covers part of the bottom portion 35a of the trench 35.

In the above embodiment, the distance D between adjacent ones of the trenches 35 in the arrangement direction of the trenches 35 is less than or equal to the width Wt of the trenches 35 but does not have to be less than or equal to the width Wt of the trenches 35. The distance D may be greater than the width Wt.

In the above embodiment, the column regions 38 are formed in correspondence with all of the trenches 35 but do not have be formed in correspondence with all of the trenches 35. For example, the column regions 38 do not have to be formed at the bottom portion 35a of the trenches 35 that do not correspond to the main cells 11A in the main cell region 11. Further, for example, the column regions 38 may be formed selectively at the bottom portions 35a of the trenches 35. More specifically, the column region 38 does not have to be formed at the bottom portion 35a of a trench 35 even if the trench 35 is a main cell 11A.

In the above embodiment, the gate trenches 22A and the emitter trenches 21A in the main cell region 11 are arranged alternately in the arrangement direction of the trenches 35 (x-direction in above embodiment) but do not have to be arranged alternately. For example, the gate trenches 22A and the emitter trenches 21A may be arranged in the arrangement direction of the trenches 35 in a manner such as a gate trench 22A, an emitter trench 21A, an emitter trench 21A, an emitter trench 21A, and a gate trench 22A.

In the above embodiment, the semiconductor device 10 may be a planar gate IGBT instead of a trench gate IGBT.

In the above embodiment, the semiconductor device 10 is embodied as an IGBT. Instead, the semiconductor device 10 may be a trench type SiC metal-oxide-semiconductor field-effect transistor (MOSFET) or Si MOSFET. In this case, the source electrode of the MOSFET corresponds to a drive electrode.

In this specification, the word "on" includes the meaning of "above" in addition to the meaning of "on" unless otherwise described in the context. Accordingly, the phrase of "A formed on B" means that A contacts B and is directly arranged on B, and may also mean, as a modified example, that A is arranged above B without contacting B. Thus, the word "on" will also allow for a structure in which another member is formed between A and B.

The z-direction referred to in this specification does not necessarily have to be the vertical direction and does not necessarily have to fully coincide with the vertical direction. Accordingly, in the structures of the present disclosure, up and down in the z-direction as referred to in this specification is not limited to up and down in the vertical direction. For example, the x-direction may be the vertical direction. Alternatively, the y-direction may be the vertical direction.

CLAUSES

Technical concepts that can be understood from the above embodiment and the modified examples will now be described. The reference characters used to denote elements of the embodiments are shown in parenthesis for the corresponding elements of the clauses described below. The reference characters are given as examples to aid understanding and not intended to limit elements to the elements denoted by the reference characters.

[Clause 1]

A semiconductor device (10), including:

a drift layer (33) of a first conductive type;

a body region (34) of a second conductive type formed in the drift region (33) at a side closer to a top surface (30s) of the drift region (33);

a trench (34) extending in a depth direction (Z-direction) through the body region (34) to the drift layer (33);

an insulation film (41) formed on a wall surface of the trench (35);

a gate electrode (21A) surrounded by the insulation film (41); and a column region (38) of a second conductive type located in the drift layer (33) at a bottom portion (35a) of the trench (35);

the drift layer (33) including:

a first region (33A) having a first concentration peak (CP1); and a second region (33B) located at a position deeper than the trench (35) and corresponding to the column region (38), the second region (33B) having a second concentration peak (CP2) that is lower than the first concentration peak (33B).

[Clause 2]

The semiconductor device according to clause 1, where:

the trench (35) includes multiple trenches (35) arranged in a state separated from each other; and the column region (38) includes multiple column regions (38) provided in correspondence with the multiple trenches (35).

[Clause 3]

The semiconductor device according to clause 2, where:

the first region (33A) is located between adjacent ones of the trenches (35) in an arrangement direction (x-direction) of the trenches (35); and the second region (33B) is located between adjacent ones of the column regions (38) in the arrangement direction (x-direction) of the trenches (35).

[Clause 4]

The semiconductor device according to clause 3, where the first region (33A) is located in the drift region (33) proximate to an interface (39A) between the drift region and the body region (34).

[Clause 5]

The semiconductor device according to clause 3 or 4, where the second region (33B) includes a portion located at a position same as the position corresponding to the column region (38) in the depth direction (z-direction) of the trench (35).

[Clause 6]

The semiconductor device according to any one of clause 3 to 5, where the second region (33B) includes a portion located at a position separated from the position corresponding to the column region (38) in the depth direction (z-direction) of the trench (35).

[Clause 7]

The semiconductor device according to any one of clauses 2 to 6, where adjacent ones of the trenches (35) in an arrangement direction (x-direction) of the trenches (35) are spaced apart by a distance (D) that is less than or equal to a width (Wt) of each of the trenches (35).

[Clause 8]

The semiconductor device according to any one of clauses 1 to 7, where the column region (38) entirely covers the bottom portion (35a) of the trench (35).

[Clause 9]

The semiconductor device according to any one of clauses 1 to 8, where the column region (38) is located at a position separated from the body region (34) in a depth direction (z-direction) of the drift layer (33).

[Clause 10]

The semiconductor device according to clause 9, where the column region (38) is in an electrically floating state.

[Clause 11]

The semiconductor device according to any one of clauses 1 to 8, where the column region (38) is connected to the body region (34).

[Clause 12]

The semiconductor device according to any one of clauses 1 to 11, where the column region (38) has an impurity concentration that is less than that of the body region (34).

[Clause 13]

The semiconductor device according to any one of clauses 1 to 12, where the column region (38) has an impurity concentration with a maximum value that is higher than the second concentration peak (CP2).

[Clause 14]

The semiconductor device according to any one of clauses 1 to 13, where the column region (38) has an impurity concentration with a maximum value that is higher than the first concentration peak (CP1).

[Clause 15]

The semiconductor device according to any one of clauses 1 to 14, where:

the drift layer (33) includes a third region (33c) located at a deeper position than the second region (33B); and the second concentration peak (CP2) is higher than an impurity concentration of the third region (33C).

[Clause 16]

The semiconductor device (10) according to any one of clauses 1 to 15, further including:

a main cell region (11), forming an IGBT, and a diode cell region (14), forming a freewheeling diode connected to the IGBT;

the trench (35) being formed in both of the main cell region (11) and the diode cell region (14); and the column region (38) being located on the bottom portion (35a) of the trench (35) formed in the main cell region (11), and on the bottom portion (35a) of the trench (35) formed in the diode cell region (14).

[Clause 17]

The semiconductor device (10) according to any one of clauses 1 to 15, further including:

a main cell region (11) that forms an IGBT and a diode cell region (14) that forms a freewheeling diode connected to the IGBT;

the trench (35) being formed in both of the main cell region (11) and the diode cell region (14); and the column region trench (38) being located selectively at the bottom portion (35a) of the trench (35) formed in the diode cell region (11) and not located at the bottom portion (35a) of the trench (35) formed in the main cell region (14).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A semiconductor device, comprising:

a drift layer of a first conductive type;

a body region of a second conductive type formed in the drift region at a side closer to a top surface of the drift region;

a trench extending in a depth direction through the body region to the drift layer;

an insulation film formed on a wall surface of the trench;

a gate electrode surrounded by the insulation film; and a column region of a second conductive type located at a bottom portion of the trench in the drift layer;

the drift layer including:

a first region having a first concentration peak; and a second region located at a position deeper than the trench and corresponding to the column region, the second region having a second concentration peak that is lower than the first concentration peak, wherein the first region and the second region are separated from one another in the depth direction.

2. The semiconductor device according to claim 1, wherein:

the trench includes multiple trenches arranged so as to be separated from each other; and the column region includes multiple column regions provided in correspondence with the multiple trenches.

3. The semiconductor device according to claim 2, wherein:

the first region is located between adjacent ones of the trenches in an arrangement direction of the trenches; and the second region is located between adjacent ones of the column regions in the arrangement direction of the trenches.

4. The semiconductor device according to claim 3, wherein the first region is located in the drift region proximate to an interface between the drift region and the body region.

5. The semiconductor device according to claim 3, wherein the second region includes a portion located at a position same as the position corresponding to the column region in the depth direction of the trench.

6. The semiconductor device according to claim 3, wherein the second region includes a portion located at a position separated from the position corresponding to the column region in the depth direction of the trench.

7. The semiconductor device according to claim 2, wherein adjacent ones of the trenches in an arrangement direction of the trenches are spaced apart by a distance that is less than or equal to width of each of the trenches.

8. The semiconductor device according to claim 1, wherein the column region entirely covers the bottom portion of the trench.

9. The semiconductor device according to claim 1, wherein the column region is located at a position separated from the body region in a depth direction of the drift layer.

10. The semiconductor device according to claim 9, wherein the column region is in an electrically floating state.

11. The semiconductor device according to claim 1, wherein the column region is connected to the body region.

12. The semiconductor device according to claim 1, wherein the column region has an impurity concentration that is less than that of the body region.

13. The semiconductor device according to claim 1, wherein the column region has an impurity concentration with a maximum value that is higher than the second concentration peak.

14. The semiconductor device according to claim 1, wherein the column region has an impurity concentration with a maximum value that is higher than the first concentration peak.

15. The semiconductor device according to claim 1, wherein:

the drift layer includes a third region located at a deeper position than the second region; and the second concentration peak is higher than an impurity concentration of the third region.

16. The semiconductor device according to claim 1, further comprising:

a main cell region, forming an IGBT, and a diode cell region, forming a freewheeling diode connected to the IGBT;

the trench being formed in both of the main cell region and the diode cell region; and the column region being located at the bottom portion of the trench formed in the main cell region, and at the bottom portion of the trench formed in the diode cell region.

17. The semiconductor device according to claim 1, further comprising:

a main cell region that forms an IGBT and a diode cell region that forms a freewheeling diode connected to the IGBT;

the trench being formed in both of the main cell region and the diode cell region; and the column region trench being located selectively at the bottom portion of the trench formed in the diode cell region and not located at the bottom portion of the trench formed in the main cell region.

18. The semiconductor device according to claim 1, wherein:

the second region includes multiple second regions arranged so as to be separated from each other in a direction perpendicular to the depth direction.

19. The semiconductor device according to claim 2, wherein:

the second region includes multiple second regions arranged so as to be separated from each other in an arrangement direction of the trenches.

* * * * *